(12) United States Patent
Ha

(10) Patent No.: US 9,438,232 B2
(45) Date of Patent: Sep. 6, 2016

(54) BUFFER CIRCUIT FOR COMPENSATING FOR A MISMATCH BETWEEN ON-DIE TERMINATION RESISTORS AND SEMICONDUCTOR DEVICE INCLUDING THE SAME, AND OPERATING METHOD THEREOF

(71) Applicant: SAMSUNG ELECTRONICS CO., LTD., Suwon-si, Gyeonggi-do (KR)

(72) Inventor: Kyung-Soo Ha, Hwaseong-si (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 14/568,402

(22) Filed: Dec. 12, 2014

(65) Prior Publication Data

US 2015/0171863 A1    Jun. 18, 2015

(30) Foreign Application Priority Data

Dec. 12, 2013 (KR) ........................ 10-2013-0154844

(51) Int. Cl.
*H03K 19/00* (2006.01)

(52) U.S. Cl.
CPC ................................. *H03K 19/0005* (2013.01)

(58) Field of Classification Search
None
See application file for complete search history.

(56) References Cited

U.S. PATENT DOCUMENTS

| | | | |
|---|---|---|---|
| 4,972,101 A * | 11/1990 | Partovi et al. .................. | 326/86 |
| 7,230,448 B2 | 6/2007 | Choe | |
| 7,269,043 B2 | 9/2007 | Lee | |
| 7,282,955 B2 | 10/2007 | Kim | |
| 7,635,990 B1 * | 12/2009 | Ren .................. | H03K 19/00369 326/30 |
| 7,772,878 B2 * | 8/2010 | Choi ............................... | 326/30 |
| 7,952,382 B2 | 5/2011 | Moon | |
| 8,508,251 B2 | 8/2013 | Choi et al. | |
| 2006/0226868 A1 * | 10/2006 | Lee et al. ......................... | 326/30 |
| 2006/0255830 A1 * | 11/2006 | Kim .................. | 326/30 |
| 2008/0001623 A1 | 1/2008 | Kim | |
| 2008/0036036 A1 * | 2/2008 | Wada ...................... | H01C 7/006 257/536 |
| 2008/0303546 A1 * | 12/2008 | Millar .................... | G11C 5/063 326/30 |
| 2009/0059704 A1 | 3/2009 | Jeong | |
| 2009/0243748 A1 * | 10/2009 | Kinoshita .......... | H03K 19/0005 333/17.3 |
| 2010/0045341 A1 | 2/2010 | Kim | |
| 2010/0165524 A1 * | 7/2010 | Lim ............................... | 361/56 |
| 2011/0163778 A1 | 7/2011 | Moon | |
| 2011/0193590 A1 * | 8/2011 | Nakagawa ........... | G11C 7/1051 326/30 |
| 2012/0056641 A1 * | 3/2012 | Kuroki ........... | H03K 19/017545 326/30 |
| 2013/0106474 A1 * | 5/2013 | Kossel et al. ................. | 327/142 |
| 2013/0182513 A1 * | 7/2013 | Eom et al. ............... | 365/189.07 |
| 2014/0159769 A1 * | 6/2014 | Hong et al. ..................... | 326/30 |
| 2014/0347141 A1 * | 11/2014 | Shibayama .............. | H03H 7/38 333/17.3 |

FOREIGN PATENT DOCUMENTS

| | | |
|---|---|---|
| KR | 1020040095912 | 11/2004 |
| KR | 1020050100290 | 10/2005 |

(Continued)

*Primary Examiner* — Crystal L Hammond
(74) *Attorney, Agent, or Firm* — F. Chau & Associates, LLC

(57) ABSTRACT

A semiconductor device is provided. The semiconductor device includes a driver circuit, a dummy circuit, and a control unit. The driver circuit is configured to provide a termination resistor at a signal transmission path. The driver circuit includes a plurality of resistors having at least two different types of resistor. The dummy circuit is electrically connected to the driver circuit and is configured to compensate for a mismatch between the at least two different types of resistors. The control unit is configured to control the dummy circuit, based on a result obtained by detecting the mismatch.

18 Claims, 19 Drawing Sheets

(56) References Cited

FOREIGN PATENT DOCUMENTS

| KR | 1020060038745 | 5/2006 |
| KR | 1020090121470 | 11/2009 |
| KR | 1020090126613 | 12/2009 |
| KR | 1020100002856 | 1/2010 |
| KR | 1020100003029 | 1/2010 |
| KR | 1020100022275 | 3/2010 |
| KR | 1020100088288 | 8/2010 |
| KR | 1020110051860 | 5/2011 |

* cited by examiner

BUFFER CIRCUIT FOR COMPENSATING FOR A MISMATCH BETWEEN ON-DIE TERMINATION RESISTORS AND SEMICONDUCTOR DEVICE INCLUDING THE SAME, AND OPERATING METHOD THEREOF

CROSS-REFERENCE TO RELATED APPLICATIONS

This application claims priority under 35 U.S.C. §119 to Korean Patent Application No. 10-2013-0154844, filed on Dec. 12, 2013, in the Korean Intellectual Property Office, the disclosure of which is incorporated by reference herein in its entirety.

TECHNICAL FIELD

The present inventive concept relates to a semiconductor device, and more particularly, to a buffer circuit for compensating a mismatch between on-die termination (ODT) resistors, a semiconductor device including the buffer circuit, and a method for operating the semiconductor device.

DISCUSSION OF THE RELATED ART

A semiconductor device may employ on-die termination (ODT) resistors to minimize signal reflection at an interface between a memory controller and a semiconductor device to enhance signal integrity (SI) characteristics. The ODT resistor may act as a termination resistor (RTT) of which impedance is matched to that of a signal transmission path, and thus, the signal reflection at signal transmission path may be minimized.

A driver circuit (or a buffer circuit) that transmits or receives a signal may include a plurality of ODT resistors having different types. A resistance value of a resistor is changed depending on a process (P), a voltage (V), and a temperature (T) (for example, PVT). When the driver circuit includes different types of resistors, resistance values of the different types of resistors may be differently changed depending on the PVT, and therefore, a mismatch occurs between the ODT resistors.

SUMMARY

According to an embodiment of the present inventive concept, a semiconductor device is provided. The semiconductor device includes a driver circuit, a dummy circuit, and a control unit. The driver circuit is configured to provide a termination resistor at a signal transmission path. The driver circuit includes a plurality of resistors having at least two different types of resistors. The at least different types of resistors include first-type resistors having a first type and second-type resistors having a second type different from the first type. The dummy circuit is configured to compensate for a mismatch between the at least two different types of resistors. The dummy circuit is electrically connected to the driver circuit. The control unit is configured to control the dummy circuit, based on a result obtained by detecting the mismatch.

The driver circuit may further include a plurality of switching units that selectively connects the plurality of resistors to the signal transmission path according to a control code.

The first-type resistors and second-type resistors may be implemented by different processes from each other.

The first-type resistor may be one of a well resistor, a poly resistor, and a metal resistor, and the second-type resistor may be the other one of the well resistor, the poly resistor, and the metal resistor.

The dummy circuit may include a dummy resistor and a switching unit. The dummy resistor may compensate for the mismatch. The switching unit may selectively connect the dummy resistor to the signal transmission path according to an output signal of the control unit.

The dummy resistor may have a resistance value corresponding to a largest resistance value among resistance values of the plurality of resistors of the driver circuit.

The control unit may include a resistance change detecting circuit and a dummy circuit. The resistance change detecting circuit may detect the mismatch by detecting resistance changes in the at least two different types of resistors. The dummy circuit selecting unit may output a dummy selection signal for selecting a dummy resistor of the dummy circuit according to the detection result of the resistance changes in the at least two different types of resistors.

The resistance change detecting circuit may include one or more first resistors having the first type, one or second resistors having the second type, and one or more comparators. The one or more comparators may be configured to compare a first resistance value based on the first resistors and a second resistance value based on the second resistors.

The dummy circuit selecting unit may include a first operator and a second operator. The first operator may receive the detection result and a control code. The second operator may receive a logic operation result of the first operator to output the dummy selection signal.

The dummy circuit selecting unit may be configured to activate the dummy selection signal when the control code has a predetermined value and the mismatch is equal to or greater than a reference value.

The dummy circuit selecting unit may be configured to activate the dummy selection signal when a connection between the first-type resistors of the driver circuit and the signal transmission path is cut off and the second-type resistors of the driver circuit are connected to the signal transmission path, according to the control code.

According to an embodiment of the present inventive concept, a buffer circuit is provided. The buffer circuit includes a driver circuit and a dummy circuit. The driver circuit includes a plurality of resistors. The driver circuit connects first resistors of the plurality of resistors to a signal transmission path according to a control code. The plurality of resistors includes at least two different types of resistors. The dummy circuit is connected to the signal transmission path to compensate for a mismatch between the at least two different types of resistors. The dummy circuit includes a dummy resistor having the same type as one of the at least two different types of resistors.

The plurality of resistors may be on-die termination (ODT) resistors.

According to an embodiment of the present inventive concept, a method for operating a semiconductor device is provided. The semiconductor device includes a buffer circuit having a driver circuit and a dummy circuit. The driver circuit includes a plurality of resistors having at least two different types of resistors. The method includes generating a control code for selecting one or more resistors among the plurality of resistors to be connected to a signal transmission path, receiving the control code and a detection signal corresponding to a match between the at least two different types of resistors, generating a dummy selection signal based on the received control code, and selecting a dummy resistor of a dummy circuit based on the dummy selection signal. The at least two different types of resistor includes first-type resistors having a first type and second-type resistors having a second type different from the first type.

BRIEF DESCRIPTION OF THE DRAWINGS

Exemplary embodiments of the present inventive concept will be more clearly understood from the following detailed description taken in conjunction with the accompanying drawings, in which.

Figure 1:
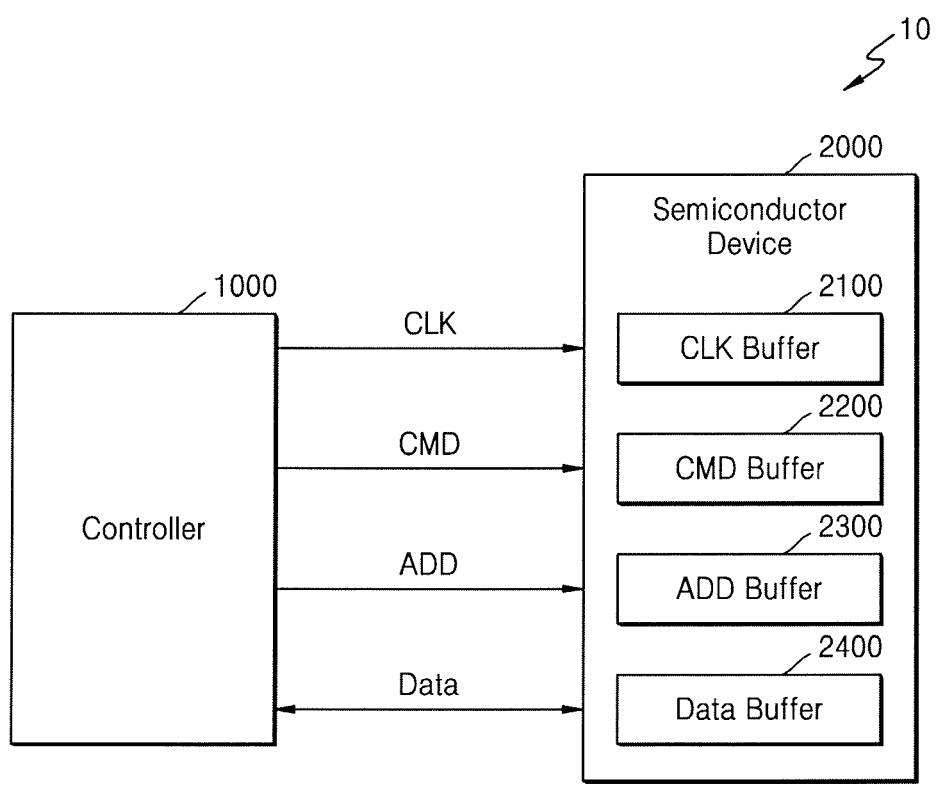
FIG. 1 is a block diagram of a semiconductor system including a semiconductor device according to an embodiment of the present inventive concept.

As used herein, the term "and/or" includes any and all combinations of one or more of the associated listed items. Hereinafter, exemplary embodiments of the present inventive concept will be described in detail with reference to the accompanying drawings. The exemplary embodiments of the present inventive concept are provided so that this disclosure will be thorough and complete, and will fully convey the concept of the present inventive concept to one of ordinary skill in the art. Since the inventive concept may have diverse modified embodiments, exemplary embodiments are illustrated in the drawings and are described in the detailed description of the inventive concept. However, this does not limit the present present inventive concept within specific embodiments and it should be understood that the present inventive concept covers all the modifications, equivalents, and replacements within the idea and technical scope of the present inventive concept. Like reference numerals may refer to like elements throughout. In the drawings, the dimensions and size of each structure may be exaggerated, reduced, or schematically illustrated for convenience in description and clarity.

Terms like "first" and "second" may be used to describe various elements, but the elements should not be limited by the terms. The terms may be used only as object for distinguishing an element from another element.

FIG. 1 is a block diagram of a semiconductor system 10 including a semiconductor device according to an embodiment of the present inventive concept.

Referring to FIG. 1, the semiconductor system 10 may include a controller 1000 and a semiconductor device 2000. For example, the semiconductor device 2000 may include various devices that perform various functions and are implemented by a semiconductor process. For example, the semiconductor device 2000 may be a memory device. In this case, the controller 1000 may be a memory controller for controlling an operation of the memory device. Hereinafter, an exemplary embodiment of the present inventive concept will be described based on the assumption that the controller 1000 is a memory controller and the semiconductor device 2000 is a semiconductor memory device. However, the present inventive concept is not limited thereto.

The controller 1000 supplies various control signals to the semiconductor device 2000 to control the operation of the semiconductor device 2000. For example, the controller 1000 may supply a command signal CMD, an address signal ADD, a clock signal CLK, and a data signal Data to the semiconductor device 2000 to access data of a cell array.

The semiconductor device 2000 may include a clock buffer 2100 that receives the clock signal CLK, a command buffer 2200 that receives the command signal CMD, an address buffer 2300 that receives the address signal ADD, and a data buffer 2400 that transmits or receives the data signal Data. The data buffer 2400 may include a reception buffer and an output buffer. The reception buffer receives the data signal Data from the outside in a data write operation, and an output buffer supplies the data signal Data to the outside in a data read operation.

At least one of the clock buffer 2100, the command buffer 2200, the address buffer 2300, and the data buffer 2400 may include an ODT circuit connected to an input/output terminal. For example, the data buffer 2400 may include the ODT circuit connected to the input/output terminal. The ODT circuit may include a plurality of ODT resistors, and each ODT resistor may include at least two different types of resistors. For example, each of the plurality of ODT resistors may include a plurality of resistors. The different types of resistors may be defined by various methods, and for example, may be resistors formed by different processes.

In addition, according to an embodiment of the present inventive concept, the data buffer 2400 may further include a dummy circuit electrically connected to the ODT circuit. The dummy circuit may be connected to the input/output terminal as a signal terminal of the data buffer 2400, and may be parallelly connected to the ODT circuit. In the different types of ODT resistors included in the ODT circuit, resistance values of the ODT resistors may be differently changed due to a PVT change. The different types of ODT resistors selectively turn on/off the dummy circuit to match impedances of the signal terminals with each other, and thus, SI characteristics may be enhanced. The dummy circuit may be identically or similarly applied to the clock buffer 2100, the command buffer 2200, and the address buffer 2300.

Figure 2:
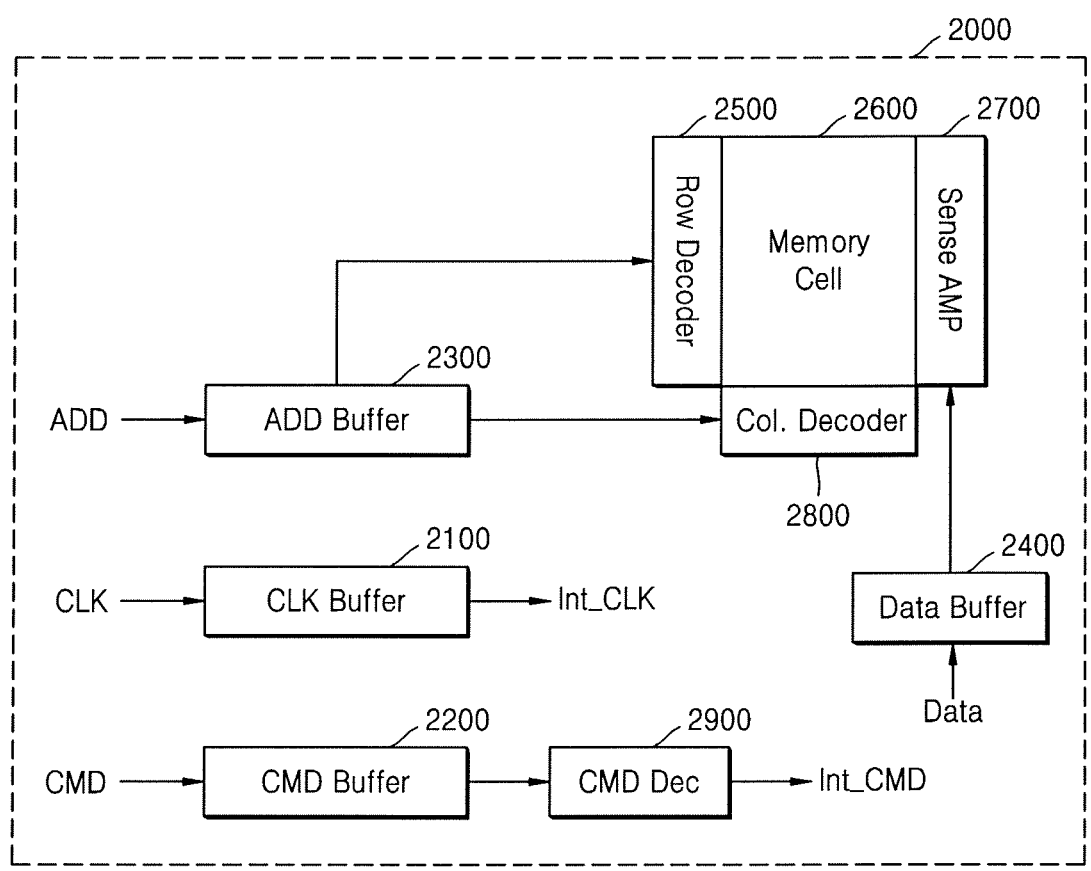
FIG. 2 is a block diagram of the semiconductor device of FIG. 1, according to an embodiment of the present inventive concept.

FIG. 2 is a block diagram of the semiconductor device (for example, the semiconductor memory device) of FIG. 1 according to an embodiment of the present inventive concept. As illustrated in FIG. 2, the semiconductor device 2000 according to an embodiment of the present inventive concept may include the clock buffer 2100, the command buffer 220, a command decoder 2800, the address buffer 2300, a row decoder 2500, a column decoder 2500, the data buffer 2400, and the sense amplifier 2700. The clock buffer 2100 receives and buffers the clock signal CLK to output the buffered clock signal CLK, for example, as an internal clock Int_CLK, to the inside of the semiconductor device 2000. The command buffer 2200 receives the command signal CMD. The command decoder 2900 decodes the command signal CMD to generate an internal command Int_CMD. The address buffer 2300 receives the address signal ADD. The row decoder 2500 and column decoder 2800 that receive the address signal ADD to perform a selection operation on a memory cell array 2600. The data buffer 2400 receives and buffers the data signal Data to supply the buffered data signal to the sense amplifier 2700. The sense amplifier 2700 amplifies read data/write data.

The command signal CDM, the address signal ADD, the clock signal CLK, and the data signal Data may be supplied from the outside through separate transmission lines. Therefore, the ODT circuit and the dummy circuit according to an embodiment of the present inventive concept may be applied to at least one of the clock buffer 2100, the command buffer 2200, the address buffer 2300, and the data buffer 2400. For example, the data buffer 2400 is the ODT circuit and includes at least two types of resistors (for example, ODT resistors). In addition, the data buffer 2400 controls the dummy circuit depending on a result which is obtained by sensing resistance changes of the different types of resistors due to the PVT change to match the impedances of the signal terminals with each other, and thus, the SI characteristics may be enhanced.

Figure 3:
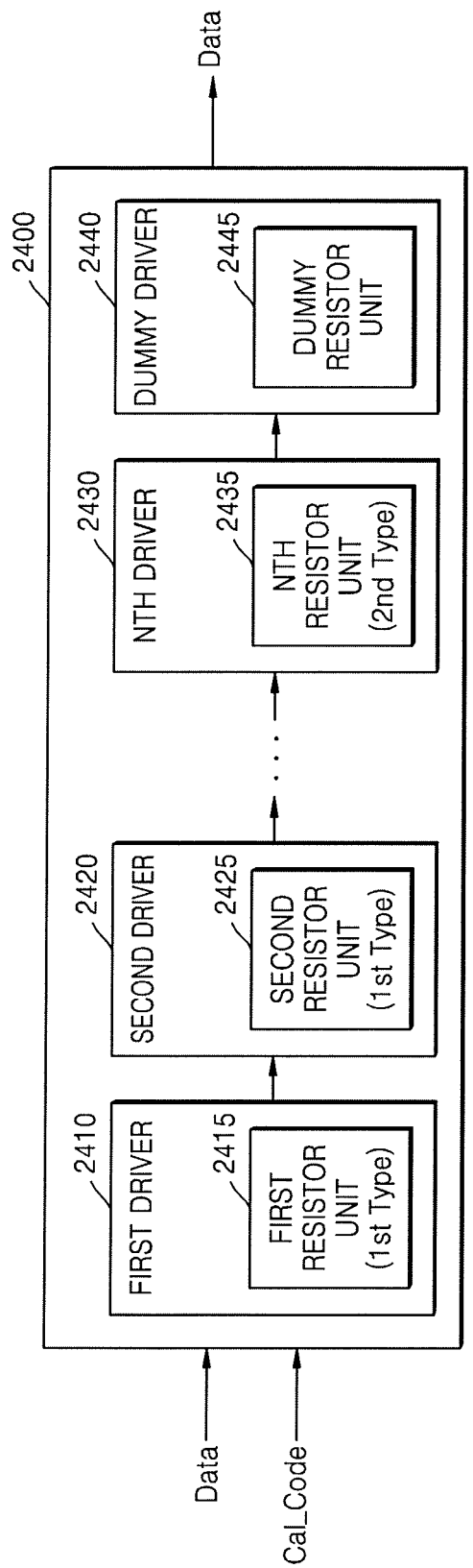
FIG. 3 is a block diagram of the data buffer of FIG. 1, according to an embodiment of the present inventive concept.

FIG. 3 is a block diagram of the data buffer 2400 of FIG. 1 according to an embodiment of the present inventive concept. As illustrated in FIG. 3, the data buffer 2400 may include one or more drivers and one or more dummy drivers, and the data buffer including the drivers may be referred to as a buffer circuit. For example, when a write operation is performed, external data may be transmitted to an internal sense amplifier, in which the drivers included in the data buffer 2400 may perform an ODT function due to resistors of the drivers. In addition, in an embodiment of the present inventive concept, when internal data of the internal sense amplifier is transmitted to the outside in a read operation, each of the drivers of the data buffer 2400 may act as an off-chip driver (OCD).

Referring to FIG. 3, the data buffer 2400 according to an embodiment may include a first driver 2410, a second driver 2420, . . . , an nth driver 2430, and a dummy driver 2440. The data buffer 2400 receives a control code Cal_Code generated by a calibration circuit (not shown) and an internal/external data signal Data, buffers the received data signal Data, and outputs the buffered data signal to the outside/inside of the semiconductor device. For example, the first driver 2410 may be an ODT resistor and include a first resistor unit 2415, the second driver 2420 may be an ODT resistor and include a second resistor unit 2425, and the nth driver 2430 may be an ODT resistor and include an nth resistor unit 2435.

A circuit including the first to nth drivers of the data buffer 2400 may be defined as a driver circuit. In the driver circuit, a configuration of each of the drivers may be changed depending on a purpose and a configuration of the data buffer 2400.

In addition, a circuit including one or more dummy drivers may be defined as a dummy circuit. As illustrated in FIG. 3, for example, the dummy circuit may include the dummy driver 2440 which may include, for example, a dummy resistor unit 2445. For example, the dummy circuit may include two or more dummy drivers. Substantially the same circuit configuration as the data buffer 2400 may be applied to the clock buffer 2100, the command buffer 2200, and the address buffer 2300. According to an embodiment of the present inventive concept, each of the clock buffer 2100, the command buffer 2200, and the address buffer 2300 may be referred to as a buffer circuit.

Resistors (for example, the first to nth resistor units) in each of the first to nth drivers 2410 to 2430 may be connected to an input/output terminal through which the data signal Data is input/output. Therefore, each of the resistors in the first to nth resistor units 2415 to 2435 may be provided as a termination resistor at the input/output terminal. Resistors included in some of the first to nth resistor units 2415 to 2435 may be each provided as the termination resistor at the input/output terminal according to the control code Cal_Code. In addition, a resistor included in the dummy resistor unit 2445 may be selectively provided as a termination resistor at an input/output terminal.

The first to nth resistor units 2415 to 2435 may include at least two types of resistors. For example, when the first to nth resistor units 2415 to 2435 are configured with two types of resistors, some of the first to nth resistor units 2415 to 2435 may include a plurality of first-type resistors, and the others may include a plurality of second-type resistors. In addition, when the first to nth resistor units 2415 to 2435 are configured with three types of resistors, each of the first to nth resistor units 2415 to 2435 may be implemented with one of first-type to third-type resistors. For example, resistors may be formed by various processes in a semiconductor process to be different types of resistors, and for example, different types of resistors may include a well resistor, a poly resistor, a metal resistor, or the like.

Figure 4:
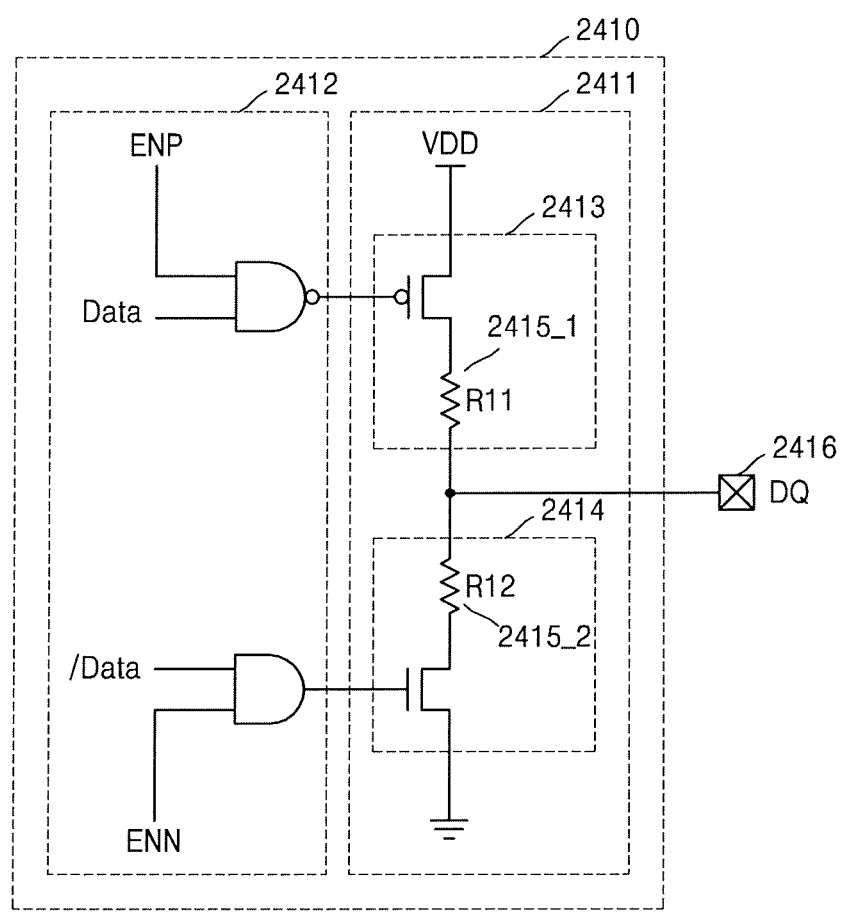
FIG. 4 is a circuit diagram of the first driver of FIG. 3 according to an embodiment of the present inventive concept.

FIG. 4 is a circuit diagram of the first driver 2410 of FIG. 3 according to an embodiment of the present inventive concept. The first driver 2410 may include a first circuit 2411 for pull-up/pull-down control and a control circuit 2412 that performs a control operation for termination control. The data signal Data is supplied to the inside/outside of the semiconductor device 2000 through the first circuit 2411 and an input/output terminal DQ 2416. The first circuit 2411 may include a pull-up unit 2413 and a pull-down unit 2414. The other drivers and the dummy driver may have substantially the same as or similar configuration to the circuit of FIG. 4.

The control circuit 2412 may receive the data signal Data and the control code Cal_Code according the above-described embodiment. The control code Cal_Code may include a first control code ENP for controlling the pull-up unit 2413 of the first circuit 2411 and a second control code ENN for controlling the pull-down unit 2414 of the first circuit 2411. In addition, the control circuit 2412 may include a first operator for receiving the data signal Data and the first control code ENP and performing a logic operation to control the pull-up unit 2413, and a second operator for receiving an inverted data signal/Data and the second control code ENN, and performing a logic operation to control the pull-down unit 2414. For example, the first operator may include a NAND gate, and the second operator may include an AND gate.

The first circuit 2411 is a first resistor unit having a first type, and the first circuit 2411 may include one or more resistors 2415_1 and 2415_2. A transistor (for example, a PMOS transistor) included in the pull-up unit 2413 may be turned on/off based on an output of the first operator, and a transistor (for example, an NMOS transistor) included in the pull-down unit 2414 may be turned on/off based on an output of the second operator. The resistors 2415_1 and 2415_2 may be the same type of resistors (for example, the first-type resistor) implemented by the same semiconductor process and may have substantially the same resistance value. A node between the pull-up unit 2413 and the pull-down unit 2414 may be connected to the input/output terminal DQ 2416. When the transistor (for example, the PMOS transistor) of the pull-up unit 2413 is turned on, a first resistor (R11) 2415_1 may be provided as a termination resistor at the input/output terminal DQ 2416 when transmitting data. In addition, when the transistor (for example, the NMOS transistor) of the pull-down unit 2414 is turned on, a second resistor (R12) 2415_2 may be provided as a termination resistor at the input/output terminal DQ 2416 when transmitting data. The termination resistor (for example, the first or second resistor 2415_1 or 2415_2) being provided at the input/output terminal DQ 2416 may be a termination resistor component being provided to the signal transmission path through the input/output terminal.

Figure 5:
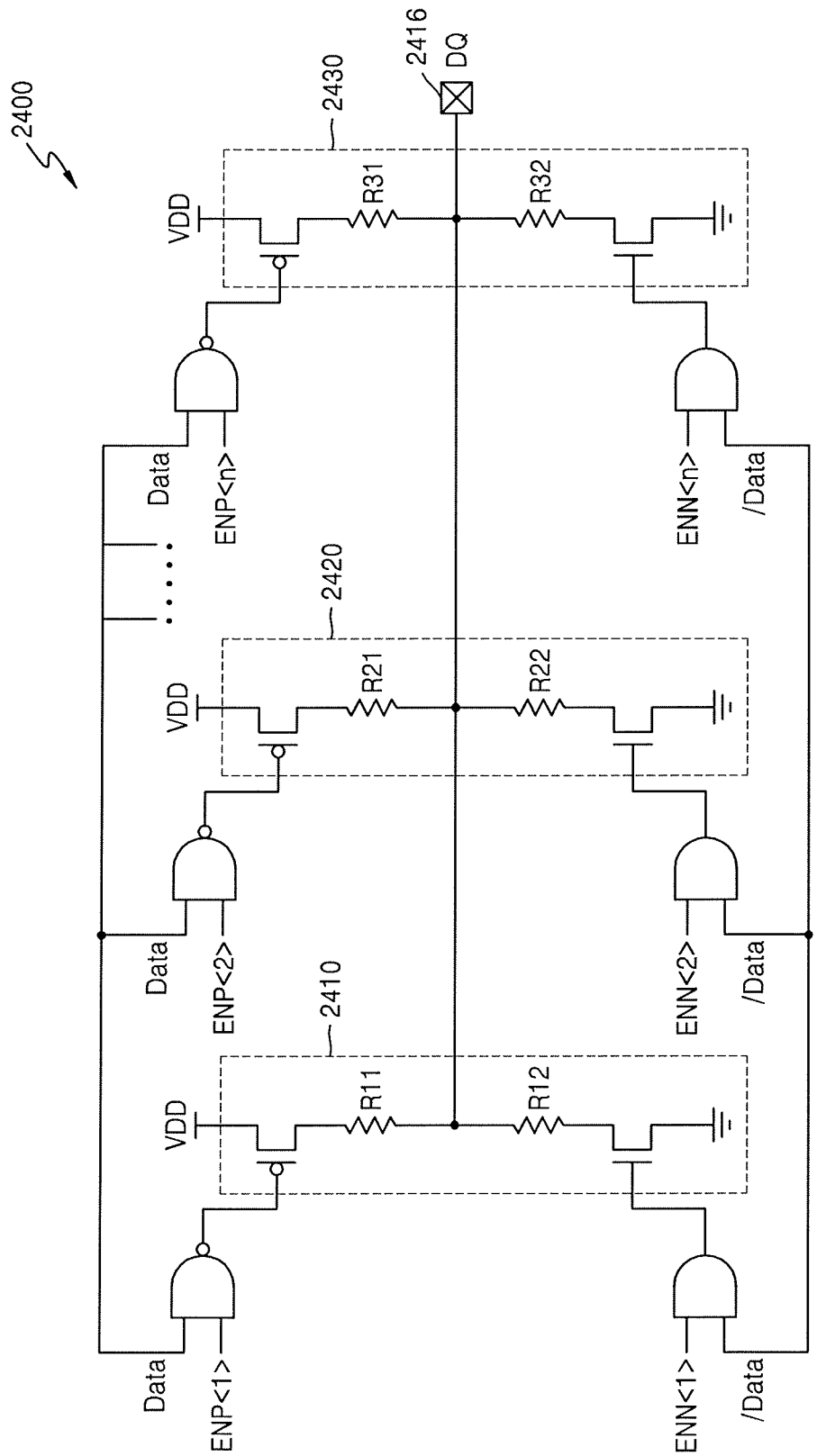
FIG. 5 is a circuit diagram of the data buffer of FIG. 3 according to an embodiment of the present inventive concept.

FIG. 5 is a circuit diagram of the data buffer 2400 of FIG. 3 according to an embodiment of the present inventive concept. In FIG. 5, an implementation example of each of the first to nth drivers 2410 to 2430 is illustrated.

Each of the first to nth drivers 2410 to 2430 may include an inverter-type CMOS circuit. For example, the first driver 2410 is a switching unit, and the first driver 2410 may include a PMOS transistor and an NMOS transistor. In addition, the first driver 2410 may include a first resistor unit having resistors R11 and R12 for providing a termination resistor. In addition, the second driver 2420 may include a CMOS circuit and a second resistor unit having resistors R21 and R22 for providing a termination resistor, and the nth driver 2430 may include a CMOS circuit and a third resistor unit having resistors R31 and R32 for providing a termination resistor. In an embodiment of the present inventive concept, the first to nth resistor units having resistors R11 to R32 include different types of resistors. For example, when two types of resistors are provided as a termination resistor, each of the first to nth resistor units may include a resistor having one of the two types.

In addition, the data buffer 2400 may include one or more logic elements for controlling the first to nth drivers 2410 to 2430. For example, as illustrated in FIG. 5, a logic element (for example, a NAND operator) that performs a NAND operation and a logic element (for example, an AND operator) that performs an AND operation may be provided to each of the first to nth drivers 2410 to 2430. When a plurality of NAND operators provided to each of the first to nth drivers 2410 to 2430 are first to nth NAND operators and a plurality of AND operators provided to the first to nth drivers 2410 to 2430 are first to nth AND operators, the first to nth NAND operators may receive the data signal Data in common. The first to nth NAND operators may respectively receive first control codes ENP<1> to ENP<n> corresponding thereto. In addition, the first to nth AND operators may receive an inverted data signal/Data in common. The first to nth AND operators may respectively receive second control codes ENN<1> to ENN<n> corresponding thereto.

Hereinafter, a detailed operation of the data buffer 2400 of FIG. 5 will be described as follows.

The data buffer 2400 may receive the data signal Data and the first and second control codes ENP and ENN. For example, the first control code ENP may include a plurality of n-bit first control codes ENP<1> to ENP<n>, and the second control code ENN may include a plurality of n-bit second control codes ENN<1> to ENN<n>. To provide a termination resistor having various values at the input/output terminal DQ, values of the first and second control codes ENP and ENN may be variously changed. For example, when the first control codes ENP<1> and ENP<n> having a value of 1 and the other first control codes having a value of 0 are received, the PMOS transistor of the second driver 2420 may be turned off irrespective of a state of the data signal Data. On the other hand, in each of the first driver 2410 and the nth driver 2430, the PMOS transistor may be turned on/off in response to the data signal Data. For example, when the data signal Data corresponds to 1, the resistor R11 connected to the pull-up unit of the first driver 2410 and the resistor R31 connected to the pull-up unit of the nth driver 2430 may be selected, and may be electrically connected to the input/output terminal DQ.

In regard to the second control codes ENN<1> to ENN<n>, for example, the second control codes ENN<1> and ENN<n> having a value of 1 and the other second control codes (for example, ENN<2>) having a value of 0 may be received. In this case, the NMOS transistor of the second driver 2420 may be turned off irrespective of a state of the inverted data signal/Data. On the other hand, in each of the first driver 2410 and the nth driver 2430, the NMOS transistor may be turned on/off in response to the inverted data signal/Data. For example, when the inverted data signal/Data corresponds to 1, the resistor R12 connected to the pull-down unit of the first driver 2410 and the resistor R32 connected to the pull-down unit of the nth driver 2430 may be selected, and may be electrically connected to the input/output terminal DQ. Thus, a termination resistor is provided at the input/output terminal DQ, and thus, an impedance match between the transmission line of a data signal and the ODT circuit is achieved.

Figure 6:
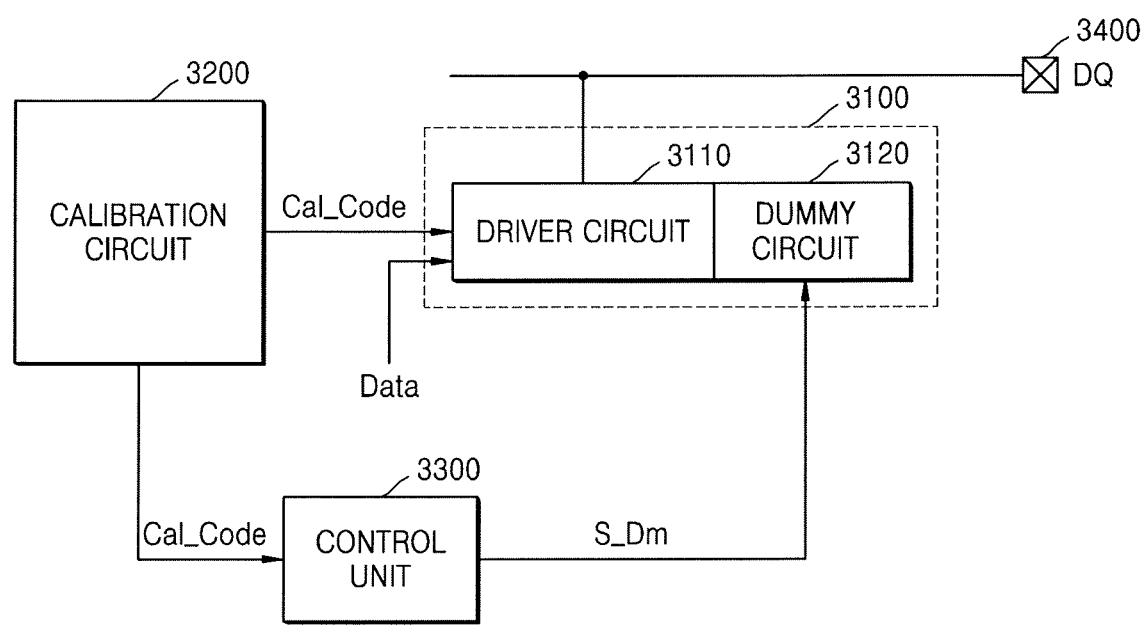
FIG. 6 is a block diagram illustrating an example of controlling resistors of an ODT circuit and a dummy circuit of a data buffer according to an embodiment of the present inventive concept.

FIG. 6 is a block diagram illustrating an example of controlling resistors of an ODT circuit and a dummy circuit of a data buffer according to an embodiment of the present inventive concept. Referring to FIG. 6, a data buffer 3100 may include a driver circuit 3110 including a plurality of drivers as in the above-described embodiments, and the drivers in the driver circuit may include an ODT circuit for providing a termination resistor. In addition, the data buffer 3100 may further include a dummy circuit 3120 to compensate for a mismatch, for example, in resistance change, between different types of resistors.

A semiconductor device according to an embodiment of the present inventive concept may include a calibration circuit 3200 which generates a control code Cal_Code for controlling a selection of an internal ODT resistor of the driver circuit 3110, and a control unit 3300 that controls a selection of a dummy resistor of the dummy circuit. However, an embodiment of the present inventive concept is not limited thereto, and for example, the control unit 3300 may be included in a controller (for example, the memory controller).

The calibration circuit 3200 may generate the control code Cal_Code to supply the control code Cal_Code to the driver circuit 3110 and the control unit 3300. The control code Cal_Code generated by the calibration circuit 3200 is used to determine a resistance value of the ODT circuit of the driver circuit 3110, and the termination resistor is provided at a transmission line through an input/output terminal 3400. In this case, when the ODT circuit includes at least two types of resistors, the dummy circuit 3120 may be connected to the driver circuit 3110 or may be connected to a signal transmission path through the input/output terminal) to compensate a mismatch between resistors (for example, the at least two types of resistors). The mismatch between the resistors may be caused by resistance changes of resistors in the ODT circuit due to a PVT change.

The driver circuit 3110 receives the control code Cal_Code and a data signal Data, and the resistors of the ODT circuit are selected according to the control code Cal_Code. The control unit 3300 receives the control code Cal_Code generated by the calibration circuit 3200 and generates a dummy selection signal S_Dm in response to the control code Cal_Code to supply the dummy selection signal S_Dm to the dummy circuit 3120. The resistors of the dummy circuit 3120 are selected according to the dummy selection signal S_Dm.

When the resistors of the ODT circuit are selected according to the control code Cal_Code, a termination resistance value provided at the signal transmission path through the input/output terminal 3400 may be adjusted. In addition, when the ODT circuit includes two or more types of resistors, resistance change characteristics of the different types of resistors due to the PVT change may differ, and thus, a mismatch between resistors may occur. A dummy resistor of the dummy circuit 3120 may be selected to compensate the mismatch between the resistors. The resistor of the dummy circuit 3120 may be parallelly connected to the driver circuit 3110, and an an SI characteristics may be enhanced by compensating for the mismatch between the resistors.

Figure 7:
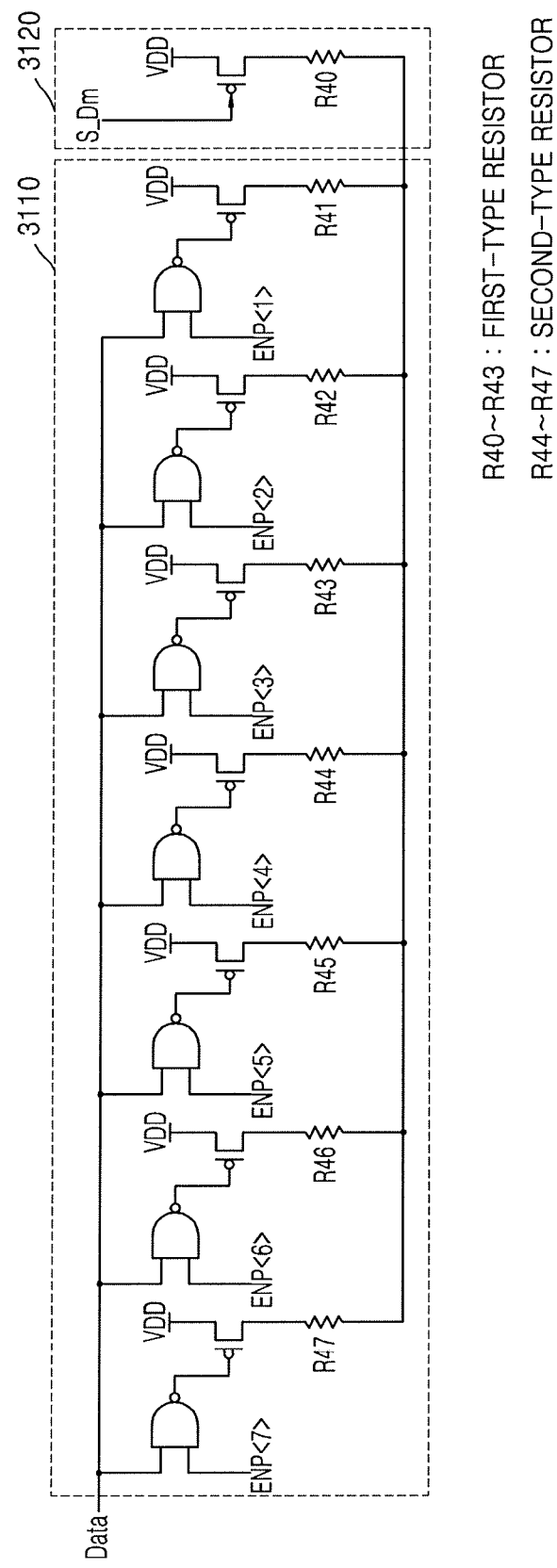
FIG. 7 is a circuit diagram of each of the driver circuit and the dummy circuit of FIG. 6 according to an embodiment of the present inventive concept.

FIG. 7 is a circuit diagram of each of the driver circuit 3110 and the dummy circuit 3120 of FIG. 6 according to an embodiment of the present inventive concept. For convenience of description, only an ODT circuit included in a pull-up unit of the driver circuit 3110 and the dummy circuit 3120 corresponding to the ODT circuit is illustrated in FIG. 7.

The driver circuit 3110 includes a plurality of drivers (for example, first to nth drivers), and in FIG. 7, seven drivers (or pull-up units of drivers) are illustrated as an example. The driver circuit 3110 receives the data signal Data and a plurality of first control codes ENP<1> to ENP<7>, and includes a plurality of ODT resistors R41 to R47 and a plurality of PMOS transistors as a switching unit for selecting the ODT resistors R41 to R47. The ODT resistors R41 to R47 of FIG. 7 may include a plurality of types of resistors, and for example, the resistors R41 to R43 may correspond to a first-type resistor, and the other resistors R44 to R47 may correspond to a second-type resistor.

Resistance values may be set by various methods. For example, resistance values may be set to increase by two times in the order of the ODT resistors R47 to the ODT resistors R41. For example, a relationship between resistance values of the resistors R41-R47 may be set as "a resistance value of R41=2*(a resistance value of R42)=4*(a resistance value of R43)=8*(a resistance value of R44) =16*(a resistance value of R45)=32*(a resistance value of R6)=64*(a resistance value of R47)". Here, "*" denotes a multiplication operator. However, the present inventive concept is not limited thereto. The number of resistors may be larger or smaller than that of the example described above, and each of the resistors may have one of the different types. In addition, the different types of resistors are respectively formed by different processes, and have different ranges of resistivity and resistance. Therefore, the resistors of the driver circuit 3110 may be variously connected depending on a termination resistance value provided at a termination line.

The dummy circuit 3120 includes a dummy resistor R40 and a switching unit, but a configuration of the dummy circuit 3120 is not limited thereto. For example, the number of dummy resistors in the dummy circuit 3120 may be one or more, and the number of switching units may be one or more depending on the number of resistors. In addition, the dummy circuit 3120 may include one or more types of resistors. The dummy circuit 3120 may include a PMOS transistor as the switching unit.

To provide a detailed description on FIG. 7, the first control codes ENP<1> to ENP<7> may have a 7-bit value each which corresponds to one of the seven drivers of the driver circuit 3110. For example, when the data signal Data is 1 and the first control codes ENP<1> to ENP<7> are 1000100, switches respectively connected to the resistors R43 and R47 may be turned on, and the other switches may be turned off. The selected resistors R43 and R47 may be provided as termination resistor components at the input/output terminal. However, an embodiment of the present inventive concept is not limited thereto, and for example, when the number of drivers (or resistors included in the drivers) of the driver circuit 3110 is n number, an n-bit control code may be input.

The dummy circuit 3120 receives the dummy selection signal S_Dm generated by the control unit 3300 of FIG. 6. When the dummy selection signal S_Dm is 1, a switch of an R40 resistor terminal is turned on and the dummy resistor R40 is provided as a termination resistance component at the input/output terminal. When the dummy selection signal S_Dm is 0, the switch of the R40 resistor end is turned off and the dummy resistor R40 is not provided as the termination resistance component at the input/output terminal. However, the preset inventive concept is not limited thereto. Therefore, the number of resistors of the dummy circuit 3120 may be one or more, and the number of switching units may be one or more depending on the number of resistors. The resistors may include one type of resistors, or include two or more types of resistors. In addition, the dummy selection signal S_Dm for selecting a resistor may be a signal of 1 bit or more depending on the number of resistors. For example, the type and number of resistors of the driver circuit 3110 may be changed depending on a termination resistance value at a termination, and thus, the type and number of resistors of the dummy circuit 3120 may be changed for preventing a mismatch between resistors due to a resistance change of the resistor of the ODT circuit included in the driver circuit 3110.

Figure 8A:
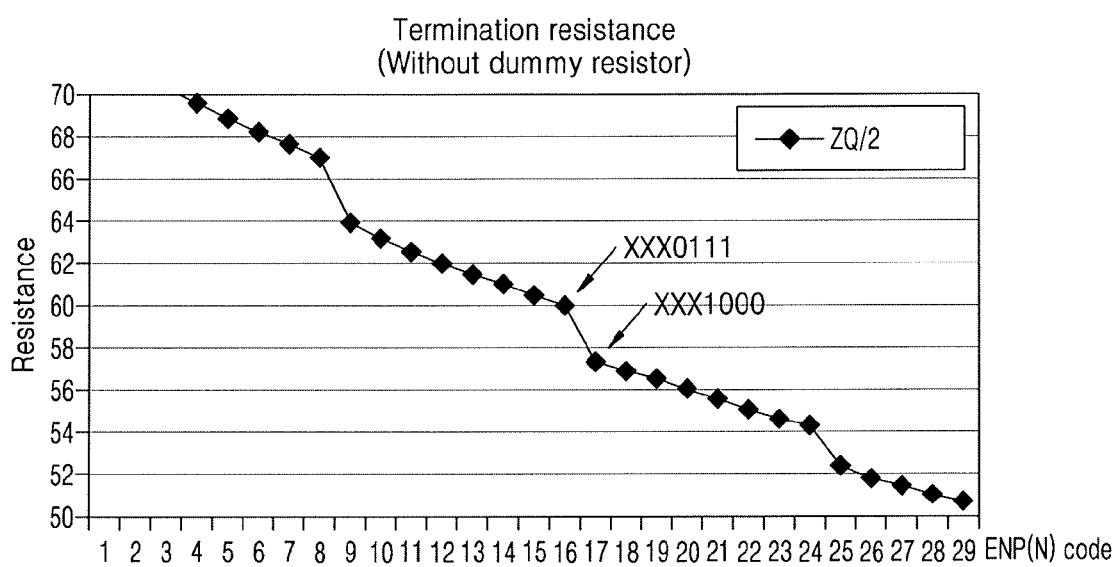
FIGS. 8A and 9A are graphs illustrating mismatches between different types of resistors due to different resistance change (caused by PVT) between ODT resistors in a driver circuit.
Figure 8B:
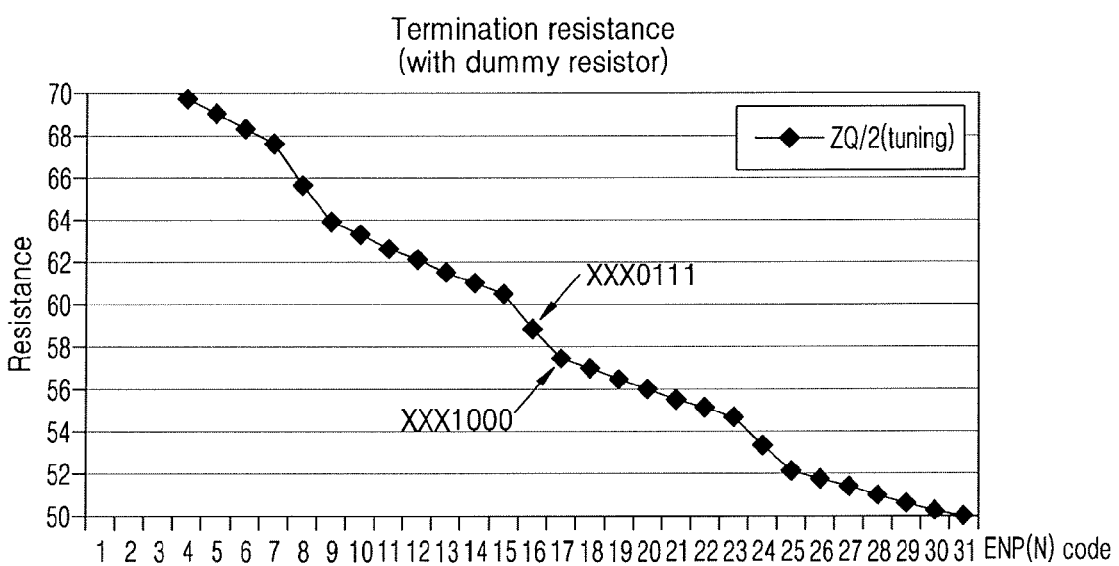
FIGS. 8B and 9B are graphs illustrating effects of cases to which a dummy resistor according to an embodiment of the present inventive concept is applied.
Figure 9A:
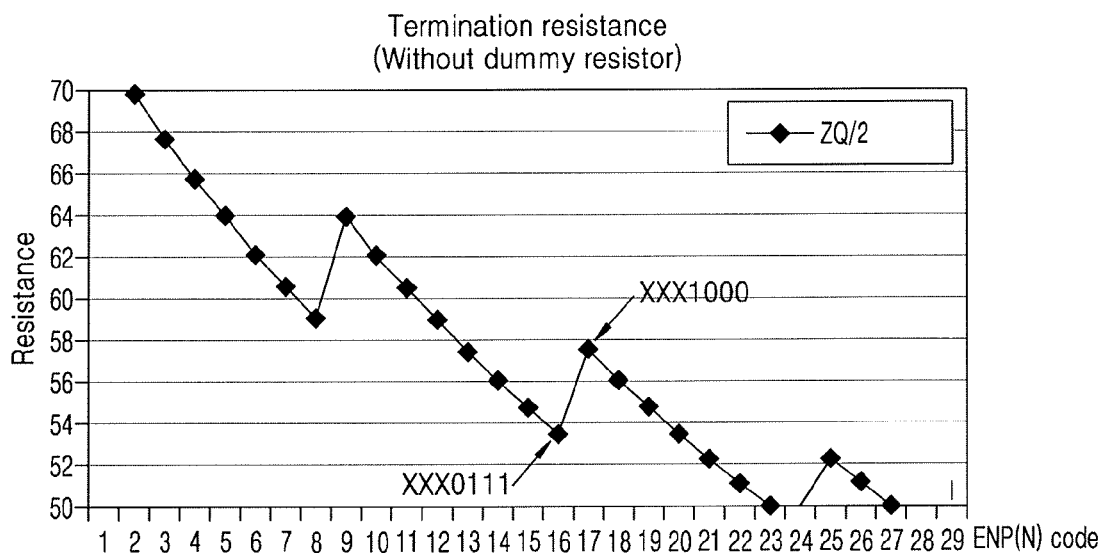
Figure 9B:
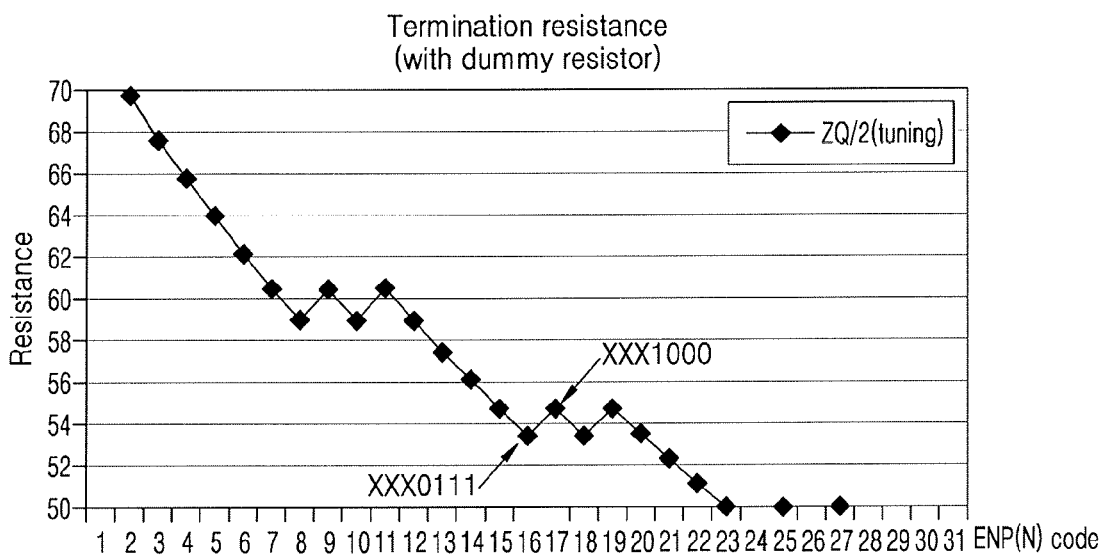

FIGS. 8A and 9A are graphs illustrating mismatches between different types of resistors due to different resistance change (caused by PVT) between ODT resistors in a driver circuit. FIGS. 8B and 9B are graphs illustrating effects of cases to which a dummy resistor according to an embodiment of the present inventive concept is applied.

Hereinafter, a mismatch between different types of resistors (for example, ODT resistors) of the driver circuit due to the PVT change and effects of the cases to which a dummy resistor according to an embodiment of the present inventive concept is applied will be described with reference to FIGS. 7 to 9. First, the resistors R41 to R43 may correspond to a first-type resistor, and the resistors R44 to R47 may correspond to a second-type resistor. For example, resistance values of the resistors may have a relationship of "a resistance value of R41=2*(a resistance value of R42)=4*(a resistance value of R43)=8*(a resistance value of R44)", and thus, the resistance value of R44 may be equal to a combined resistance value of "R43||R42||R41||R41". Here, "||" is an operator for combining resistances between resistors in parallel. However, the first-type resistor and the second-type resistor may have different resistance changes from each other due to the PVT change, and thus, the resistance value of R44 might not be equal to the combined resistance value of "R43||R42||R41||R41". For example, the resistance changes of different types of resistors being different due to the PVT change may be defined as a mismatch between the different types of resistors. For example, an amount of resistance change of the first-type resistor may be less than that of the second-type resistor, as illustrated in FIG. 8A, or greater than that of the second-type resistor, as illustrated in FIG. 9A. Referring to FIG. 8A, a large resistance difference may occur between a first control code XXX0111 and a second control code XXX1000. For example, the first control code XXX0111 may be a control code when the resistors R41 to R43 are selected, and the second control code XXX1000 may be a control code when the resistor R44 is selected. When the amount of resistance change of the first-type resistor is less than that of the second-type resistor, a resistance change as shown in FIG. 8A may occur. Thus, when a termination resistance value of, for example, about 59Ω is needed, the driver circuit might not be able to supply a corresponding resistance value. Therefore, when the first control code of XXX0111 is provided, the resistor R40 of the dummy circuit may be selected and may be parallelly connected to the resistors of the driver circuit to compensate for a mismatch between resistors. Thus, as shown in FIG. 8B, the termination resistance value may be about 59Ω.

Referring to of FIG. 9A, when a control code is changed between a first control code XXX0111 and a second control code XXX1000, a resistance difference is large because an inverse resistance occurs. For example, the first control code XXX0111 is a control code when the resistors R41 to R43 are selected, and the second control code XXX1000 is a control code when the resistor R44 is selected. The large difference in resistance between the first control code XXX0111 and the second control code XXX1000 may occur because the amount of resistance change of the first-type resistor may be greater than that of the second-type resistor. Due to the inverse resistance, a desired termination resistance value might not be provided. To provide the desired termination resistance value, when a control code has a value of XXX0111, the resistor R40 of the dummy circuit may be selected and may be parallelly connected to the resistors of the driver circuit, thereby moderating the inverse resistance as shown in FIG. 9B. However, an embodiment of the present inventive concept is not limited thereto. The resistors of the driver circuit and the dummy circuit may be changed depending on a termination resistance value provided at a termination, and the present inventive concept may be applied to be suitable for each condition.

Figure 10:
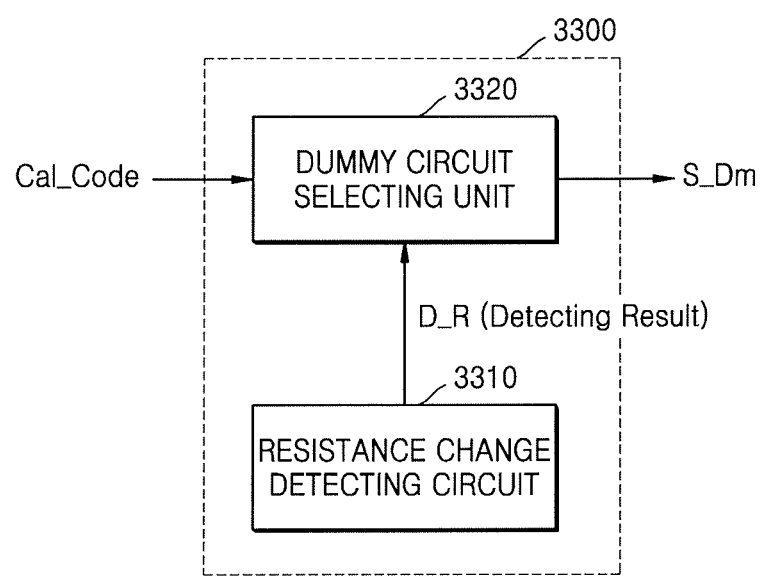
FIG. 10 is a block diagram of the control unit of FIG. 6 for selecting a dummy resistor according to an embodiment of the present inventive concept.

FIG. 10 is a block diagram of the control unit 3300 of FIG. 6 for selecting a dummy resistor according to an embodiment of the present inventive concept. As illustrated in FIG. 10, the control unit 3300 may include a resistance change detecting circuit 3310 and a dummy circuit selecting unit 3320. The resistance change detecting circuit 3310 detects a mismatch between resistors, and the dummy circuit selecting unit 3320 generates the dummy selection signal S_Dm. The resistance change detecting circuit 3310 is a circuit that detects the mismatch between the resistors which is caused by resistance changes of the ODT resistors of the driver circuit due to the PVT change. The resistance change detecting circuit 3310 generates a detection signal D_R by determining whether the mismatch between the resistors occurs, and supplies the detection signal D_R to the dummy circuit selecting unit 3320. The dummy circuit selecting unit 3320 receives the control code Cal_Code and the detection signal D_R, and supplies the dummy selection signal S_Dm, which is used to control a selection of the dummy resistor, to the dummy circuit based on the received signals.

As in the above-described embodiment, when the control code Cal_Code has a certain value or is changed to a certain value, the dummy circuit selecting unit 3320 may output the dummy selection signal S_Dm to compensate for the mismatch between the resistors. Even though, PVT is changed, when a difference between resistance changes of different types of resistors is equal to or less than a certain value, the mismatch between the resistors might not be compensated for. Therefore, the control unit 3300 may include the resistance change detecting circuit 3310, and when the difference between the resistance changes is greater than the certain value, the control unit 3300 may control to selective the dummy resistor.

Figure 11:
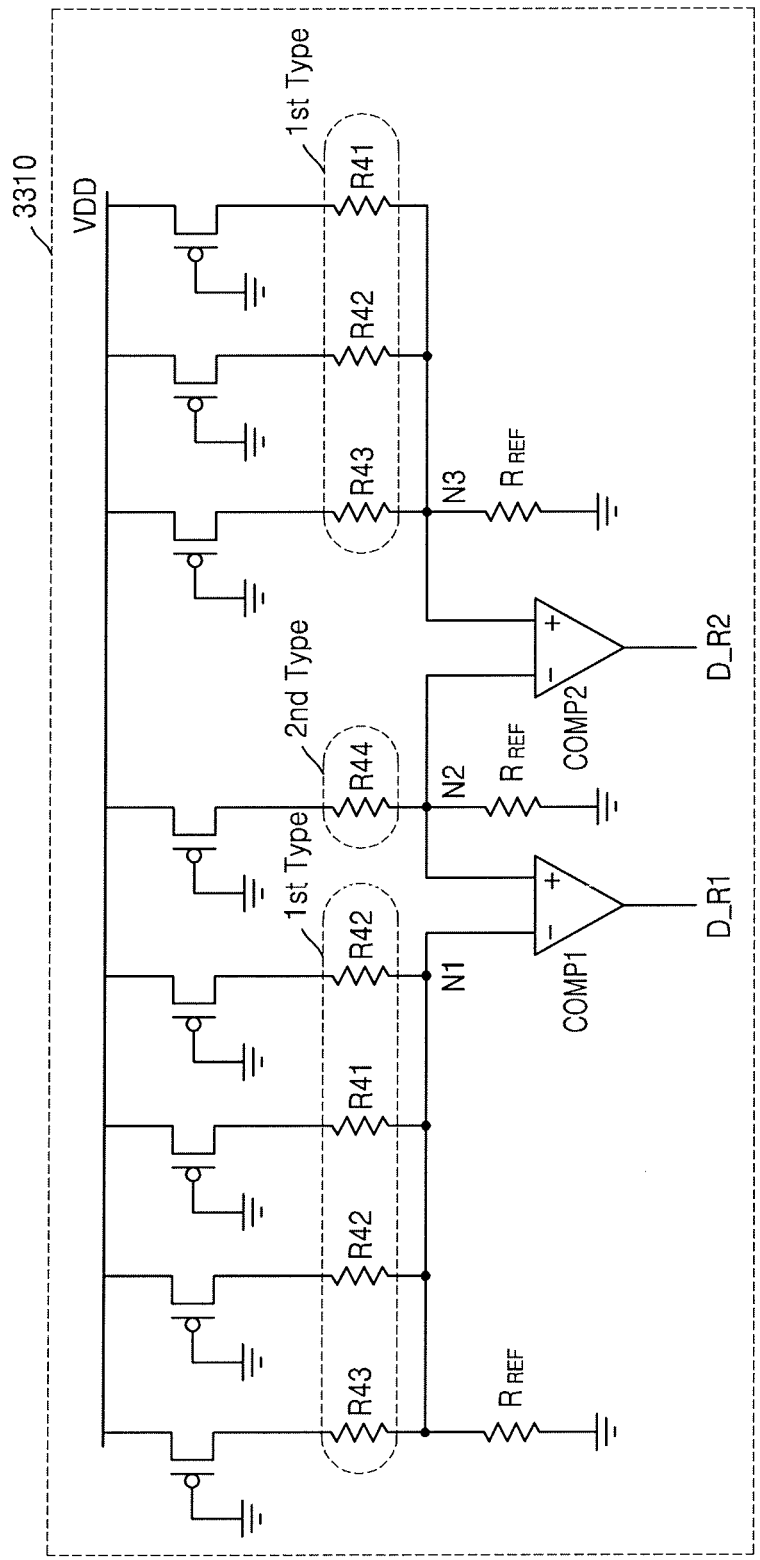
FIG. 11 is a circuit diagram of a resistance change detecting circuit of FIG. 10 according to an embodiment of the present inventive concept.

FIG. 11 is a circuit diagram of the resistance change detecting circuit 3310 of FIG. 10 according to an embodiment of the present inventive concept. Resistors R41 to R44 of FIG. 11 may have the same type and resistance value as those of the resistors 41 to R44 of FIG. 7. Referring to FIG. 11, a switch connected to a terminal $V_{DD}$ is in a turn-on state and is connected to a corresponding resistor. In addition, the resistance change detecting circuit 3310 may include a comparator that compares voltage levels at respective terminals. A resistor $R_{REF}$ has a resistance value that becomes a reference for comparing voltages at respective resistor terminals. A resistance value of the resistor $R_{REF}$ may be variously set and changed. For example, the resistor $R_{REF}$ may have substantially the same resistance value as that of the resistor R44 corresponding to a second-type resistor.

Hereinafter, an operating method of the resistance change detecting circuit 3310 will be described in detail.

First, under a condition in which PVT is not changed, a combined resistance value of "R43||R42||R41||R41" may be smaller than a resistance value of R44, and when PVT is changed, the combined resistance value of "R43||R42||R41||R41" may become greater than the resistance value of R44 by the mismatch between the resistors due to the PVT change, which may correspond to, for example, the case described above with reference to FIG. 8. In this case, a first detection signal D_R1 may have a logic high value (for example, 1). The first detection signal D_R1 is an output of a first comparator COMP1 that compares a voltage at a first resistor terminal N1 corresponding to an negative (−) input terminal of the first comparator COMP1 and a voltage at a second resistor terminal N2 corresponding to a positive (+) input terminal of the first comparator COMP1 in FIG. 11. In the other case (for example, the case when the combined parallel resistance value of "R43∥R42∥R41∥R41" does not become greater than the resistance value R44), the first detection signal D_R1 may have a logic low value (for example, 0). This may correspond to a case in which a resistance value of the second-type resistor R44 more greatly decrease than the first-type resistors R41 to R43 does, due to the PVT change.

Second, under a condition in which PVT is not changed, a combined resistance value of "R43∥R42∥R41" may be greater than a resistance value of R44, and when PVT is changed, the combined resistance value of "R43∥R42∥R41" may become smaller than the resistance value of R44" by the mismatch between the resistors due to the PVT change, which may correspond to, for example, the case described above with reference to FIG. 9. In this case, a second detection signal D_R2 may have a logic high value (for example, 1). The second detection signal is an output of a second comparator COMP2 that compares the voltage at the second resistor terminal N1 corresponding to an negative (−) input terminal of the second comparator COMP2 and a voltage at a third resistor terminal N3 corresponding to a positive (+) input terminal of the second comparator COMP2 in FIG. 11). In the other case (for example, the case when the combined resistance value of "R43∥R42∥R41∥R41" does not become smaller than the resistance value of R44), the second detection signal D_R2 may have a logic low value (for example, 0). This may correspond to a case in which the resistance value of the second-type resistor R44 more greatly increase than the first-type resistors R41 to R43 does, due to the PVT change. Whether to select the resistor of the dummy circuit as the termination resistance component may be controlled based on the first and second detection signals D_R1 and D_R2.

However, the present inventive concept is not limited thereto. For example, a resistance value of a resistor of each terminal may be changed based on a degree of mismatch between resistors, and thus, a configuration of each resistor may be changed. In addition, a terminal of each resistor may be provided in plural depending on a configuration of each resistor, and the number of output signals may correspond to the number of comparators. The resistor $R_{REF}$ has an optimal value based on each condition.

Figure 12:
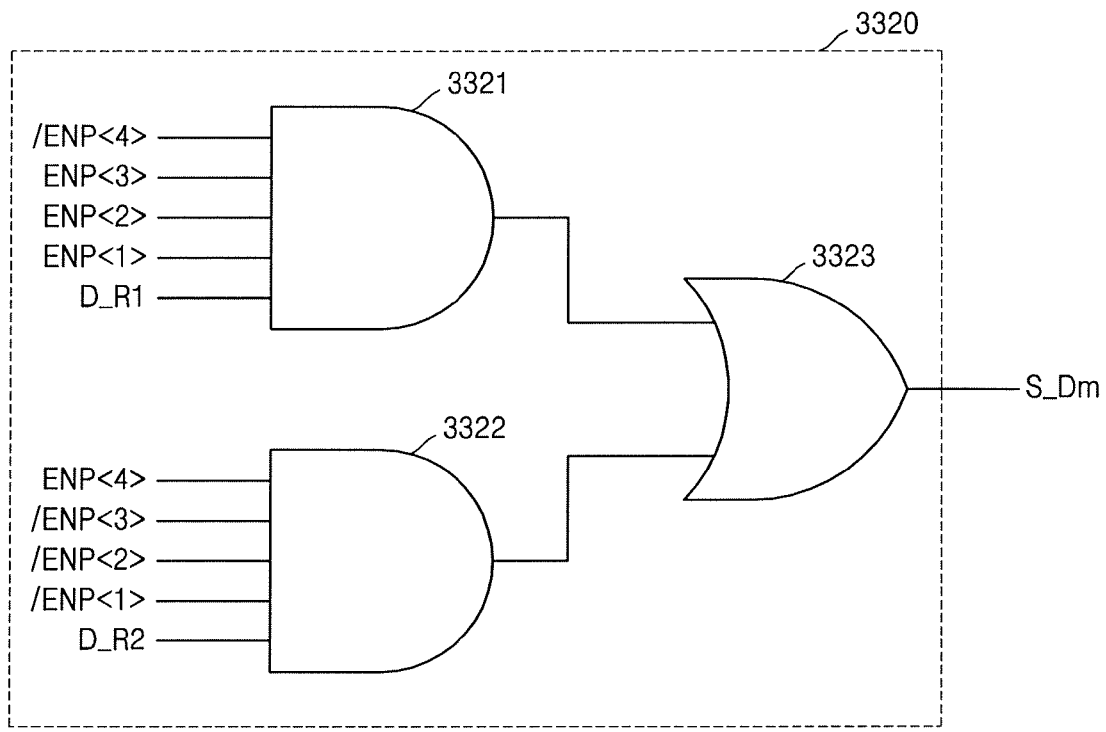
FIG. 12 is a circuit diagram of a dummy circuit selecting unit of FIG. 10 according to an embodiment of the present inventive concept.

FIG. 12 is a circuit diagram of the dummy circuit selecting unit 3320 of FIG. 10 according to an embodiment of the present inventive concept. The dummy circuit selecting unit 3320 may include a plurality of logic elements that receives the control code Cal_code and an output signal (for example, the first detection signal D_R1 or the second detection signal D_R2) of the resistance change detecting circuit 3310. For example, as illustrated in FIG. 12, the dummy circuit selecting unit 3320 may include first and second AND gates 3321 and 3322 and an OR gate 3323 that receives outputs of the first and second AND gates 3321 and 3322. The OR gate 3323 may output the dummy selection signal S_Dm to select the dummy resistor of the dummy circuit. In FIG. 12, for convenience of description, signals and logic elements for controlling a dummy circuit corresponding to a pull-up unit of the driver circuit are illustrated.

Hereinafter, a detailed operation of the dummy circuit selecting unit 3320 will be described. A signal ENP is a control code for selecting an ODT resistor of a pull-up of the driver circuit. When a first control code "XXX0111" and the first detection signal D_R1 having a logic high value (for example, 1) are input to the first AND gate 3321, the first AND gate 3321 outputs a logic high signal (for example, 1). In this case, the OR gate 3323 outputs the dummy selection signal S_Dm corresponding to the logic high signal (for example, 1) irrespective of an output value of the second AND gate 3322. Thus, the dummy resistor of FIG. 7 is selected and the selected dummy resistor is provided as the termination resistor component. In addition, when a second control code "XXX1000" and the second detection signal D_R2 having a logic high value (for example, 1) are input to the second AND gate 3322, the second AND gate 3322 outputs a logic high signal (for example, 1). In this case, the OR gate 3323 outputs the dummy selection signal S_Dm corresponding to the logic high signal (for example, 1) irrespective of an output value of the first AND gate 3321. Thus, the dummy resistor of FIG. 7 is selected and the selected dummy resistor is provided as the termination resistor component.

According to the above-described embodiment, to select the dummy resistor of the dummy circuit, the dummy resistor may be selected when the control code (for example, the first control code "XXX0111" or the second control code "XXX1000") is input as a certain value. In addition, resistance changes of the first-type and the second-type resistors due to the PVT change are detected, the dummy resistor is selected when a degree of mismatch between resistors is equal to or greater than a reference value, and thus, the mismatch between the resistors is compensated for.

However, the present inventive concept is nut limited thereto. For example, a control code input to an AND gate (for example, the first AND gate 3321 or the second AND gate 3322) may be changed depending on the mismatch (for example, the degree of mismatch) between the resistors. For example, when the number of output signals of the resistance change detecting circuit is two or more, the dummy circuit selecting unit 3320 may include two or more AND gates. In addition, when the resistor of the dummy circuit is provided in plural, the dummy selection signal S_Dm for controlling the resistors may include a multi-bit signal, and thus, the dummy circuit selecting unit 3320 may include one or more OR gates.

Figure 13:
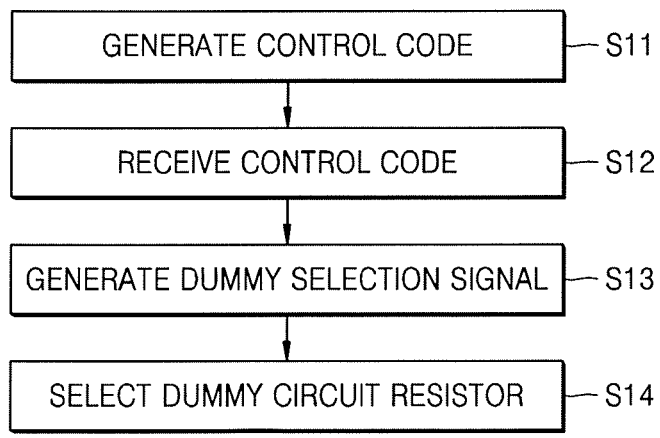
FIG. 13 is a flowchart illustrating an operating method of a semiconductor device according to an embodiment of the present inventive concept.

FIG. 13 is a flowchart illustrating an operating method of a semiconductor device according to an embodiment of the present inventive concept. The calibration circuit generates the control code Cal_Code which is used to select the resistors of the driver circuit 3110 and to provide the termination resistor component in operation S11. In operation S12, the control unit 3300 for selecting the dummy resistor of the dummy circuit 3120 receives the generated control code Cal_Code. In operation S13, the control unit 3300 generates the dummy selection signal S_Dm, based on the received control code Cal_Code. For example, the control unit 3300 may generate the dummy selection signal S_Dm to select the dummy resistor when the control code Cal_Code has a certain value. For example, when the control code Cal_Code has a first value, the first-type resistors of the driver circuit 3110 may be selected. In addition, when the control code Cal_Code has a second value, a selection of the first-type resistors may be cut off, and then, when one or more second-type resistors of the driver circuit 3110 are selected, the dummy selection signal S_Dm for selecting the dummy resistor may be generated. In operation S14, the dummy resistor of the dummy circuit 3120 is selected according to the dummy selection signal S_Dm. Thus, a mismatch between different types of resistors in the driver circuit 3110 is compensated for.

Figure 14:
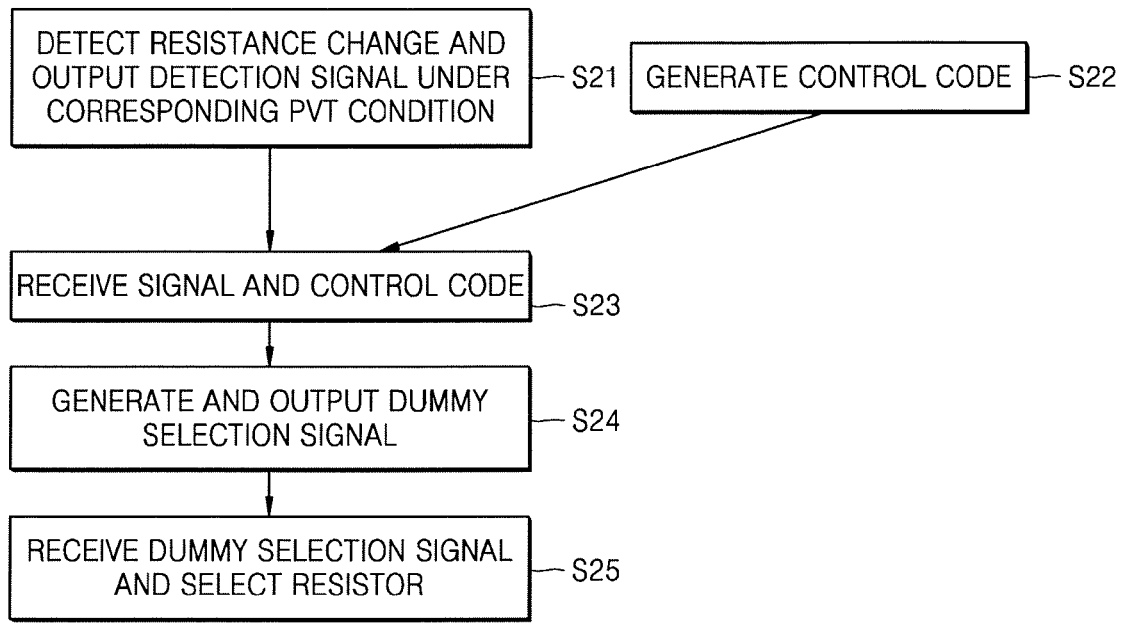
FIG. 14 is a flowchart illustrating an operating method of a semiconductor device according to an embodiment of the present inventive concept.

FIG. 14 is a flowchart illustrating an operating method of a semiconductor device, according to an embodiment of the present inventive concept. The control unit 3300 may include the resistance change detecting circuit 3310 that detects a mismatch between resistors due to the PVT change. For example, the mismatch between the resistors due to the PVT change may correspond to a difference in resistance change between the resistors. In operation S21, the control unit 3300 outputs the detection signal D_R based on a resistance change detection result under corresponding PVT conditions. In operation S22, as in the above-described embodiments, the control code Cal_Code for selecting the resistors of the driver circuit 3110 is generated. In operation S23, the dummy circuit selecting unit 3320 receives the control code Cal_Code and the detection signal D_R. In operation S24, the dummy circuit selecting unit 3320 generates and outputs the dummy selection signal S_Dm for selecting the dummy resistor of the dummy circuit 3120, based on the received signal. In operation S25, the dummy resistor of the dummy circuit 3120 is selected in response to the dummy selection signal S_Dm. As in the above-described embodiment, when the control code Cal_Code has a certain value, the dummy resistor may be selected depending on the resistance change detection result.

Figure 15:
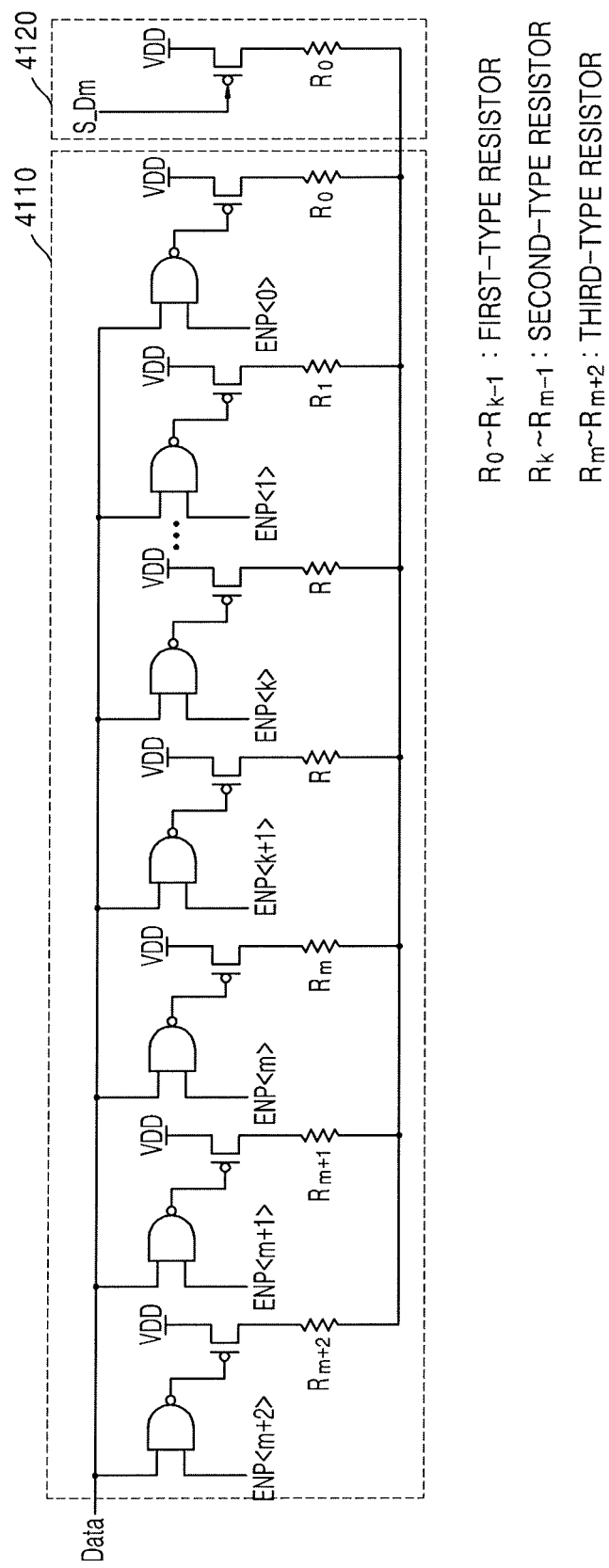
FIG. 15 is a circuit diagram of each of a driver circuit and a dummy circuit according to an embodiment of the present inventive concept.

FIG. 15 is a circuit diagram illustrating of each of a driver circuit 4110 and a dummy circuit 4120 according to an embodiment of the present inventive concept. For convenience, only a circuit included in a pull-up unit of the driver circuit 4110 is illustrated in FIG. 15.

Referring to FIG. 15, resistors of the driver circuit 4110 may include a plurality of types of resistors, and an example in which the driver circuit 4110 includes three types of resistors is illustrated. For example, the driver circuit 4110 may include a plurality of drivers, and each of the drivers may include an ODT resistor. The ODT resistors (for example, R0, R1, . . . , Rk−1) of some of the drivers may be first-type resistors, the ODT resistors (for example, Rk, Rk+1, . . . , Rm−1) of some of the other drivers may be second-type resistors, and the ODT resistors (for example, Rm, Rm+1, and Rm+2 . . . ) of the other drivers may be third-type resistors. A plurality of control codes ENP<0>, ENP<1>, . . . , ENP<k>, ENP<k+1>, ENP<m+1>, . . . for selecting the resistors of the driver circuit 4110 may be supplied to the driver circuit 4110. The dummy circuit 4120 may include one or more dummy resistors R0. For example, the dummy resistor R0 is a first-type resistor and has substantially the same resistance value as that of a resistor R0 included in a first driver of the driver circuit 4110, as illustrated in FIG. 15. The dummy resistor R0 may be selected according to a dummy selection signal S_Dm, and as in the above-described embodiment, the dummy selection signal S_Dm may be generated based on a control code and a resistance change detection result.

Figure 16:
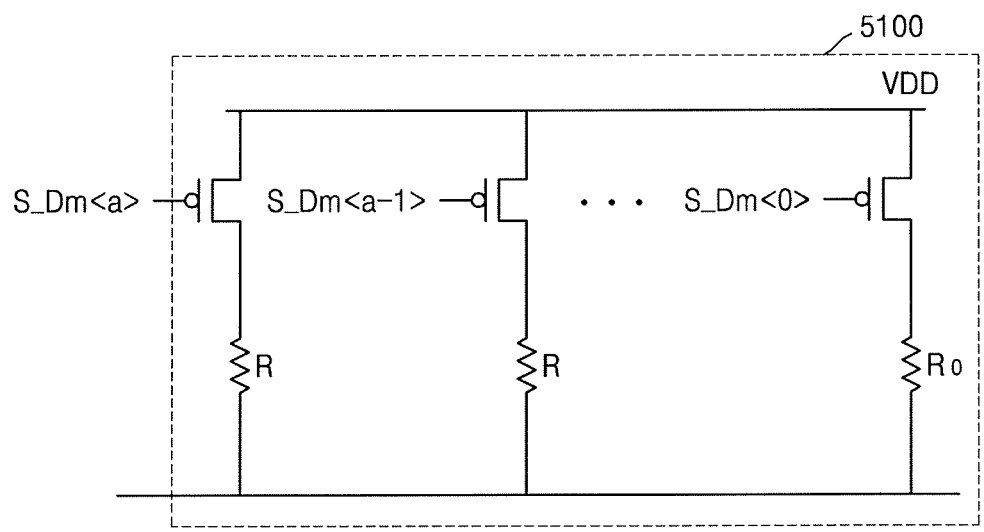
FIGS. 16 and 17 are circuit diagrams of dummy circuits according to embodiments of the present inventive concept.
Figure 17:
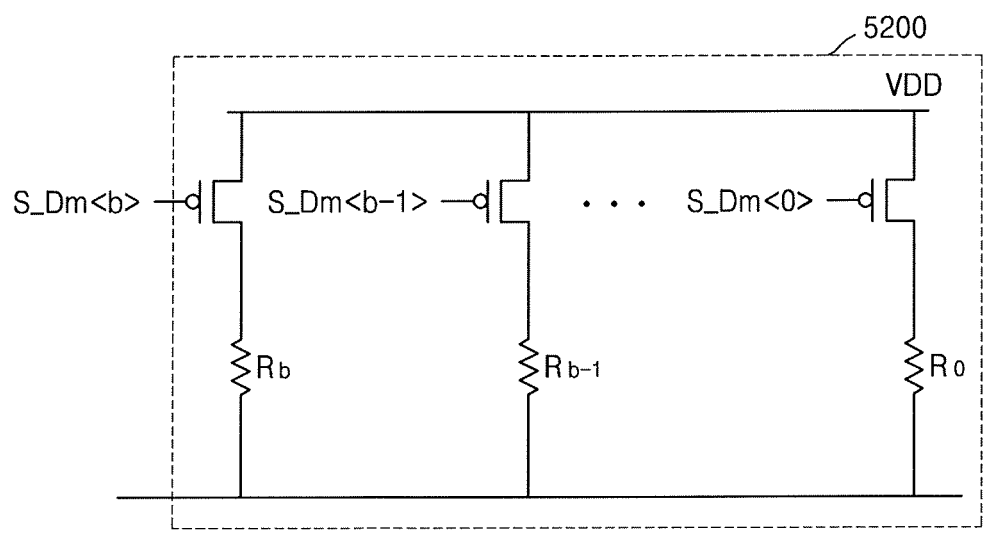

FIGS. 16 and 17 are circuit diagrams of dummy circuits 5100 and 5200 according to embodiments of the present inventive concept. As illustrated in FIG. 16, the dummy circuit 5100 may include one or more dummy resistors for which selections are controlled according to dummy selection signals S_Dm<0> to S_Dm<a> having 1 bit or more. For example, the dummy circuit 5100 may include a plurality of resistors having the same type and a plurality of dummy resistors having the same resistance value. One or more dummy resistors may be selected according to the dummy selection signals S_Dm<0> to S_Dm<a>, and thus, a mismatch between resistors may be compensated for using various values.

As illustrated in FIG. 17, one or more resistors included in the dummy circuit 5200 may include different types of dummy resistors. For example, dummy selection signals S_Dm<0> to S_Dm<a> may be supplied to a corresponding one of a plurality of dummy resistors R0 to Rb of the dummy circuit 5200. Some of the dummy resistors R0 to Rb may be first-type resistors, and the other may be second-type, third-type, or other-type resistors. As described above, one or more dummy resistors may be selected according to the dummy selection signals S_Dm<0> to S_Dm<a>, and thus, a mismatch between resistors may be compensated for using various values.

However, the present inventive concept is not limited thereto. Therefore, the type, number, and resistance value of the dummy resistor in each of the dummy circuits 5100 and 5200 may be different according to a degree of mismatch between resistors of the driver circuit.

Figure 18:
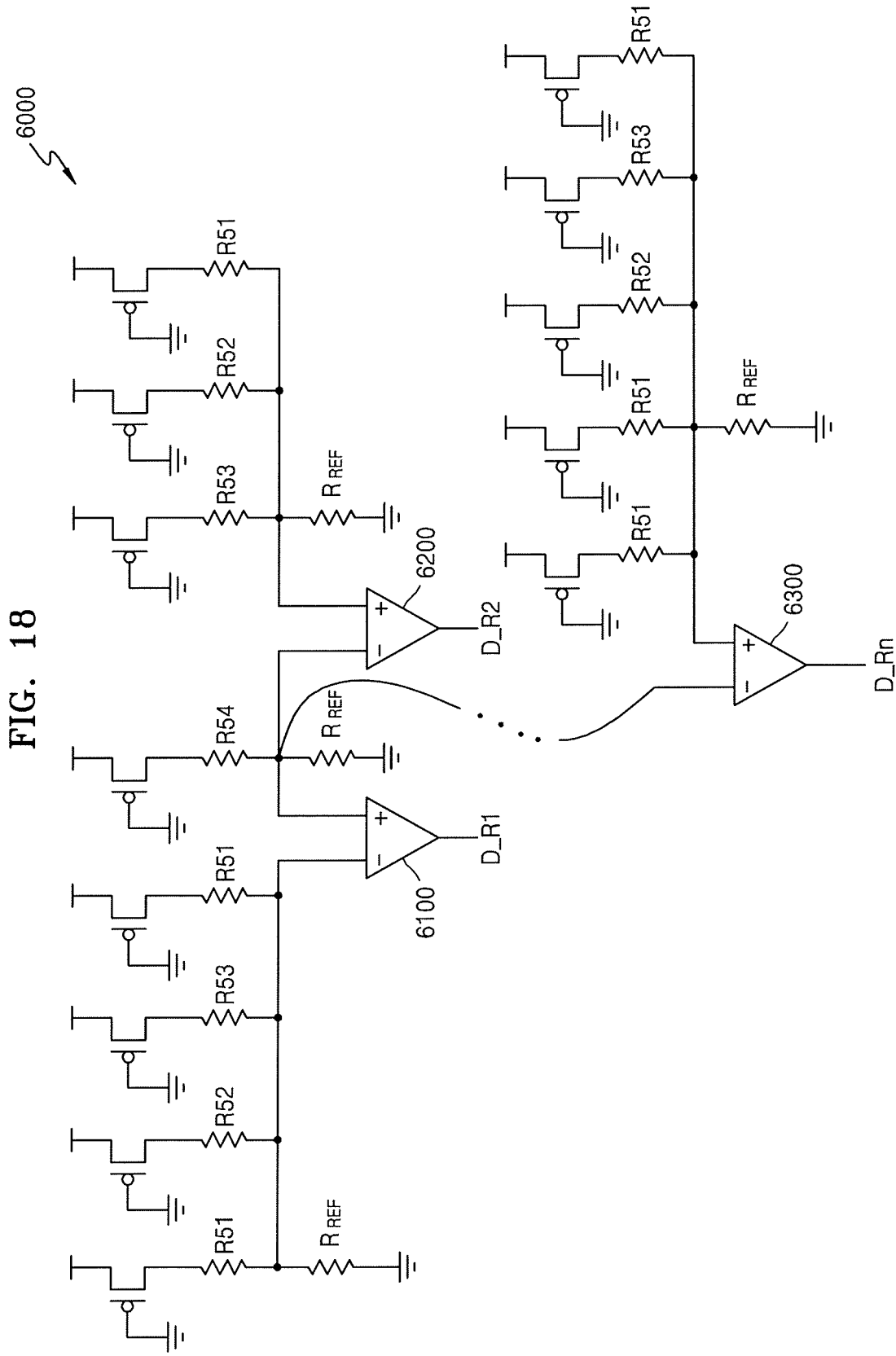
FIG. 18 is a circuit diagram of a resistance change detecting circuit of a control unit according to an embodiment of the present inventive concept.

FIG. 18 is a circuit diagram of a resistance change detecting circuit 6000 of a control unit according to an embodiment of the present inventive concept. Various combinations of resistors included in a driver circuit may be implemented, and thus, degrees of mismatch between resistors may differ. Therefore, the resistance change detecting circuit 6000 for detecting the mismatch may be variously implemented to be suitable for the resistors of the driver circuit.

As illustrated in FIG. 18, the resistance change detecting circuit 6000 may include a plurality of comparators for detecting resistance changes of different types of resistors due to a PVT change. For example, in FIG. 18, three comparators are illustrated, and resistors having different resistance values are respectively connected to one of the terminals of the comparators. For example, four resistors R51 to R53 and R51 may be connected to an input terminal of a first comparator 6100, three resistors R51 to R53 may be connected to an input terminal of a second comparator 6200, and five resistors R51, R51 to R53, and R51 may be connected to an input terminal of a third comparator 6300. In addition, another resistor (for example, a resistor R54) may be connected to the other input terminals of the first to third comparators 6100, 6200, and 6300. The resistors R51 to R53 are resistors having the same type (for example, a first-type resistor). The resistor R54 is a resistor having another type (for example, a second-type resistor) different from the first-type resistor.

The first to third comparators 6100, 6200, and 6300 may output first to third detection signals D_R1, D_R2, and D_Rn, respectively. Therefore, the second-type resistor (for example, the resistor R54) may be compared with the first-type resistor (for example, the resistor R51, R52, or R53) corresponding to various resistance values, and a mismatch between resistors is precisely compensated for to be suitable for a condition according to the comparison result.

Figure 19:
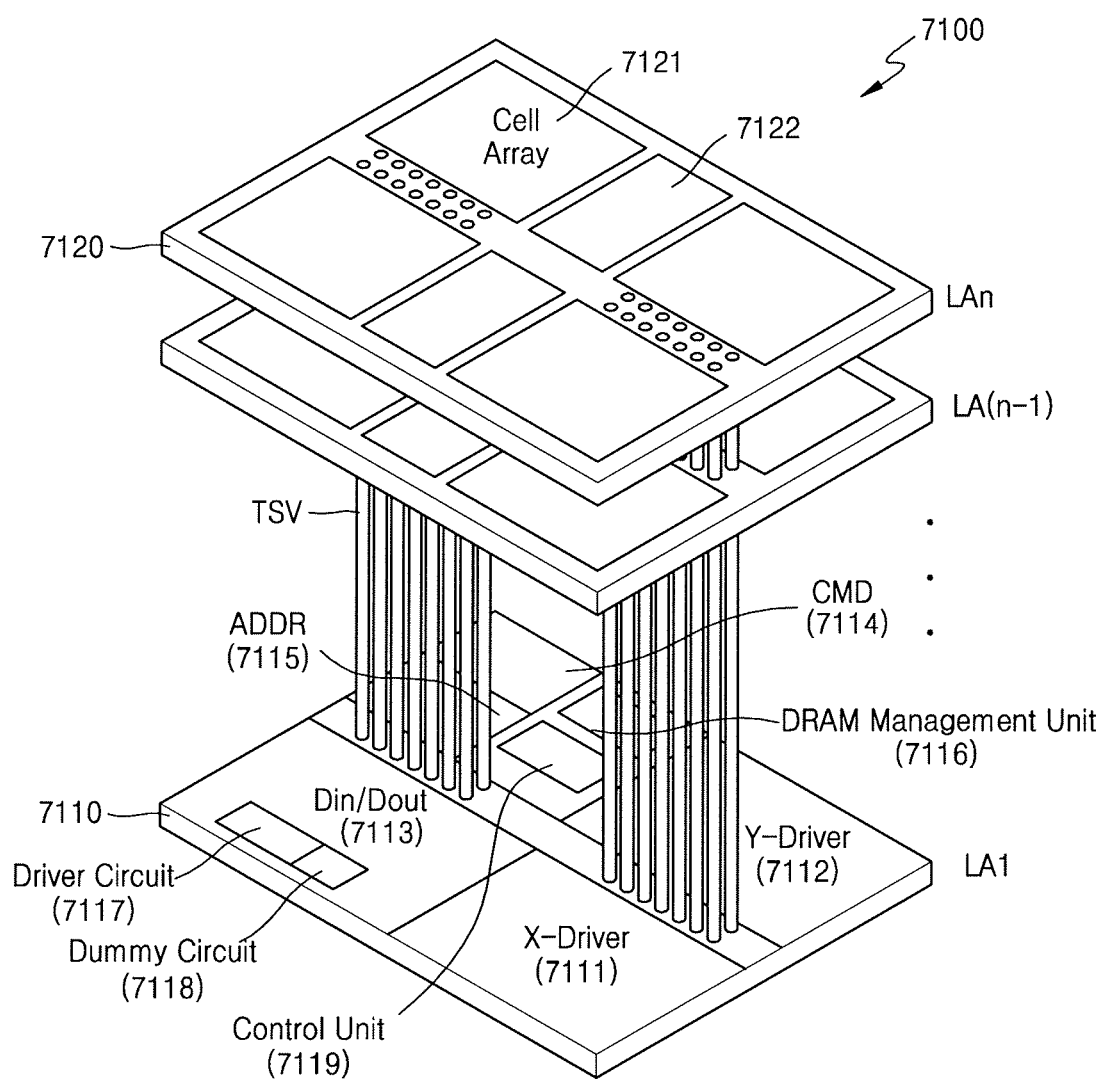
FIG. 19 is a diagram illustrating a semiconductor device according to an embodiment of the present inventive concept.

FIG. 19 is a diagram illustrating a semiconductor device 7100 according to an embodiment of the present inventive concept. FIG. 19 illustrates an example in which the semiconductor device 7100 is implemented by stacking a plurality of semiconductor layers. For example, the semiconductor device 7100 may be a semiconductor memory device.

As illustrated in FIG. 19, the semiconductor device 7100 may include a plurality of semiconductor layers LA1 to LAn. Each of the semiconductor layers LA1 to LAn may be a memory chip including a dynamic random access memory (DRAM). In addition, one of the semiconductor layers LA1 to LAn may be a master chip that interfaces with an external controller, and the others may be slave chips that store data. In FIG. 19, the lowermost semiconductor layer LA1 may be the master chip, and the other semiconductor layers LA2 to LAn may be the slave chips. However, the present inventive concept is not limited thereto.

The semiconductor layers LA1 to LAn mutually transmit or receive a signal through a through-silicon via (TSV), and the master chip (for example, the semiconductor layer LA1) communicates with an external memory controller (not shown) through a conductive means (not shown), which is provided at an outer surface. A configuration and operation of the semiconductor device 7100 will now be described with respect to a first semiconductor layer 7110 (for example, a master chip) and an nth semiconductor layer 7120 (for example, a slave chip).

The first semiconductor layer 7110 includes various circuits for driving a cell array 7121 included in the slave chip. For example, the first semiconductor layer 7110 may include a row driver (for example, an X-driver) 7111 for driving a word line of the cell array 7121, a column driver (for example, a Y-driver) 7112 for driving a bit line, a data buffer 7113 for controlling an input/output of data, a command buffer 7114 for receiving a command signal CMD from the outside, and an address buffer 7115 for receiving and buffering an address signal ADD from the outside. According to an embodiment of the present inventive concept, at least one of the buffers may include a dummy circuit to compensate for a mismatch between resistors. For example, as illustrated in FIG. 19, the data buffer 7113 may include a driver circuit 7117 that provides a termination resistor at a signal transmission path for a data signal, and a dummy circuit 7118 that compensates for a mismatch between ODT resistors included in the driver circuit 7117.

In addition, the first semiconductor layer 7110 may further include a DRAM management unit 7116 for managing a memory operation of the slave chip. The DRAM management unit 7116 may include a control unit 7119 that controls the dummy circuit 7118. The nth semiconductor layer 7120 may include the cell array 7121 and a peripheral circuit region 7122 in which other peripheral circuits for driving the cell array 7121 (for example, a row/column selecting unit for selecting a row and column of the cell array 7121, a bit line sense amplifier, etc.) are disposed.

According to the embodiment of FIG. 19, the DRAM management unit 7116 may further include a calibration circuit (not shown) for generating the above-described control code. The control unit 7119 may control a selection of a dummy resistor included in the dummy circuit, based on the control code. In addition, as in the above-described embodiment, the control unit 7119 may include an element for detecting the mismatch between the ODT resistors and an element for generating a dummy selection signal. The selection of the dummy resistor included in the dummy circuit may be controlled according to the dummy selection signal.

Figure 20:
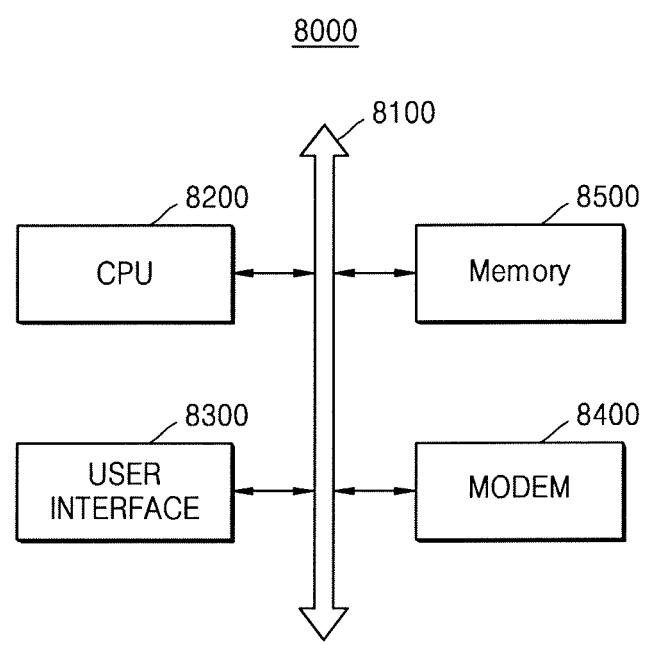
FIG. 20 is a block diagram illustrating a computer system including a semiconductor device according to an embodiment of the present inventive concept.

FIG. 20 is a block diagram illustrating a computer system 8000 including a semiconductor device according to an embodiment of the present inventive concept.

Referring to FIG. 20, the computer system 8000 may include a system bus 8100, a central processing unit (CPU) 8200 that is electrically connected to the system bus 8100, a user interface 8300, a memory 8500, and a modem 8400 such as a baseband chipset. The user interface 8300 may be an interface for transmitting data to a communication network or receiving data from the communication network.

The user interface 8300 may be a wired/wireless type, and may include an antenna or a wired/wireless transceiver. The memory 8500 may store data which is supplied through the user interface 8300 or the modem 8400, or is obtained through processing by the CPU 8200.

The memory 8500 may include a volatile memory device, such as a DRAM, and a nonvolatile memory device such as a flash memory. The memory 8500 may include the driver circuit according to embodiments of the present inventive concept, a DRAM, a phase-change random access memory (PRAM), a magnetoresistive random access memory (MRAM), a resistive random access memory (ReRAM), a ferroelectric random access memory (FRAM), a NOR flash memory, a NAND flash memory, a fusion flash memory or the like (for example, a memory in which a static random access memory (SRAM) buffer, an NAND flash memory, and a NOR interface logic are combined), in which the dummy circuit is provided.

When the computer system 8000 according to an embodiment of the present inventive concept is a mobile device, the computer system 8000 may further include a battery (not shown) that supplies an operation voltage of the computer system 8000. Although not shown, the computer system 8000 may further include an application chipset, a camera image processor (CIP), an input/output device, or the like.

Figure 21:
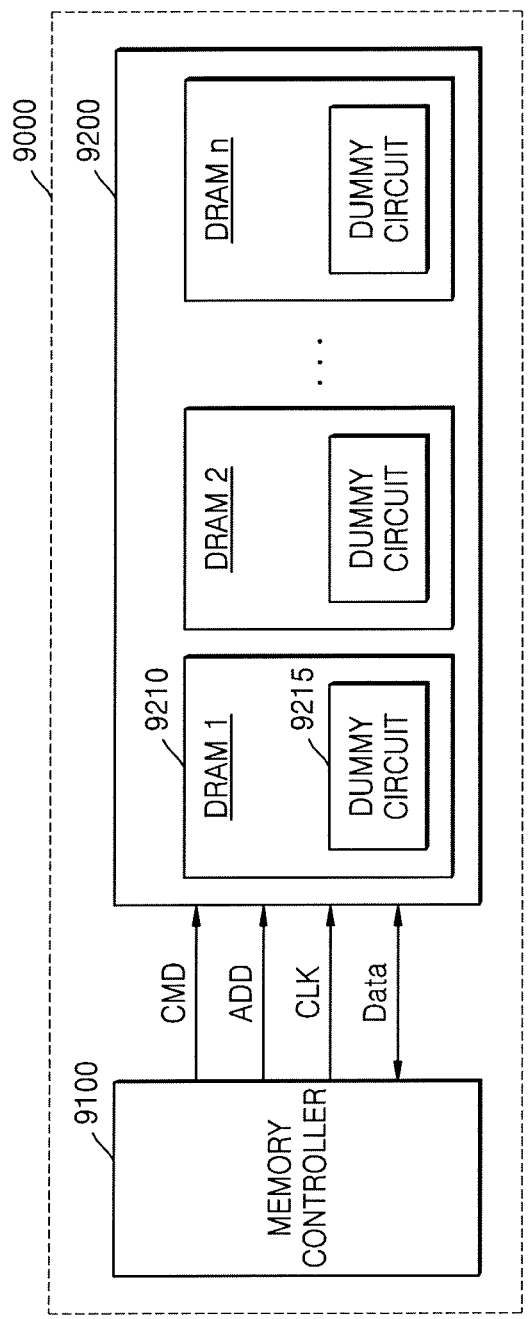
FIG. 21 is a block diagram of a memory module according to an embodiment of the present inventive concept.

FIG. 21 is a block diagram of a memory module according to an embodiment of the present inventive concept. As illustrated in FIG. 21, a memory system 9000 includes a memory controller 9100 and a memory module 9200. The memory module 9200 includes one or more semiconductor memory devices 9210 mounted on a module board. For example, the semiconductor memory device 9210 may be a DRAM chip. In addition, a memory management chip (not shown) for managing a memory operation of the semiconductor memory device 9210 may be further mounted on the module board.

The memory controller 9100 supplies various signals (for example, a command signal CMD, an address signal ADD, and a clock signal CLK) for controlling the semiconductor memory device 9210 included in the memory module 9200. The memory controller 9100 supplies a data signal Data to the semiconductor memory device 9210 or receives a data signal Data from the semiconductor memory device 9210, during communication with the memory module 9200. The memory module 9200 includes a plurality of DRAMs 9210, and each of the DRAMs 9210 includes a dummy circuit 9215 according to an embodiment of the present inventive concept, and thus, a mismatch between ODT resistors included in a driver circuit is compensated for.

While the present inventive concept has been particularly shown and described with reference to exemplary embodiments thereof, it will be understood that various changes in form and detail may be made therein without departing from the spirit and scope of the present inventive concept.

What is claimed is:

1. A semiconductor device comprising:
   a driver circuit configured to provide a termination resistor at a signal transmission path, wherein the driver circuit comprises a plurality of resistors including at least two different types of resistors in terms of resistance change characteristics, wherein the at least different types of resistors include first-type resistors having a first type of resistance change characteristics and a second-type resistors having a second type of resistance change characteristics different from the first type of resistance change characteristics;

a dummy circuit configured to compensate for a mismatch in the resistance change characteristics between the at least two different types of resistors by selectively connecting a dummy resistor of the dummy circuit to the signal transmission path according to a dummy selection signal; and a control unit configured to generate the dummy selection signal, wherein the control unit comprises:

a resistance change detecting circuit configured to detect the mismatch by detecting resistance changes in the at least two different types of resistors; and a dummy circuit selecting unit configured to output the dummy selection signal for selecting the dummy resistor of the dummy circuit according to the detection result of the resistance changes in the at least two different types of resistors.

2. The semiconductor device of claim 1, wherein the driver circuit further comprises a plurality of switching units that selectively connects the plurality of resistors to the signal transmission path according to a control code.

3. The semiconductor device of claim 1, wherein the first- and second-type resistors are implemented by different processes from each other.

4. The semiconductor device of claim 1, wherein the first-type resistor is one of a well resistor, a poly resistor, or a metal resistor, and the second-type resistor is the other one of the well resistor, the poly resistor, or the metal resistor.

5. The semiconductor device of claim 1, wherein the dummy resistor has a resistance value corresponding to a largest resistance value among resistance values of the plurality of resistors of the driver circuit.

6. The semiconductor device of claim 1, wherein the resistance change detecting circuit comprises:

one or more first resistors having the first type of resistance change characteristics;

one or more second resistors having the second type of resistance change characteristics; and one or more comparators configured to compare a first resistance value based on the first resistors and a second resistance value based on the second resistors.

7. The semiconductor device of claim 1, wherein the dummy circuit selecting unit comprises:

a first operator configured to receive the detection result and a control code; and a second operator configured to receive a logic operation result of the first operator to output the dummy selection signal.

8. The semiconductor device of claim 7, wherein the dummy circuit selecting unit is configured to activate the dummy selection signal when the control code has a predetermined value and an amount of the mismatch is equal to or greater than a reference value.

9. The semiconductor device of claim 7, wherein the dummy circuit selecting unit is configured to activate the dummy selection signal when a connection between the first-type resistors in the driver circuit and the signal transmission path is cut off and the second-type resistors in the driver circuit are connected to the signal transmission path, according to the control code.

10. A buffer circuit comprising:

a driver circuit including a plurality of resistors, wherein the driver circuit connects first resistors of the plurality of resistors to a signal transmission path according to a control code, and the plurality of resistors includes at least two different types of resistors in terms of resistance change characteristics;

a dummy circuit including a dummy resistor selectively connected to the signal transmission path, according to a dummy selection signal, to compensate for a mismatch in the resistance change characteristics between the at least two different types of resistors, wherein the dummy resistor of the dummy circuit has the same type of resistance change characteristics as one of the at least two different types of resistors;

a control unit comprising:

a resistance change detecting circuit configured to detect the mismatch by detecting resistance changes in the at least two different types of resistors; and a dummy circuit selecting unit configured to output the dummy selection signal for selecting the dummy resistor of the dummy circuit according to the detection result of the resistance changes in the at least two different types of resistors.

11. The buffer circuit of claim 10, wherein the at least two different types of resistors are implemented by different processes from each other.

12. The buffer circuit of claim 10, wherein the dummy resistor has a resistance value corresponding to a largest resistance value among resistance values of the plurality of resistors.

13. The buffer circuit of claim 10, wherein the dummy resistor is connected to the signal transmission path when the control code has a predetermined value and an amount of the mismatch is equal to or greater than a reference value.

14. The buffer circuit of claim 10, wherein the plurality of resistors are on-die termination (ODT) resistors.

15. A method for operating a semiconductor device, wherein the semiconductor device includes a buffer circuit having a driver circuit and a dummy circuit, and the driver circuit includes a plurality of resistors having at least two different types of resistors in terms of resistance change characteristics, comprising:

generating a control code for selecting one or more resistors among the plurality of resistors to be connected to a signal transmission path;

receiving the control code and a detection signal corresponding to a match in the resistance change characteristics between the at least two different types of resistors;

generating a dummy selection signal based on the received control code;

selectively connecting a dummy resistor of the dummy circuit to the signal transmission path based on the dummy selection signal;

detecting a mismatch by detecting resistance changes in the at least two different types of resistors; and outputting the dummy selection signal for selecting the dummy resistor of the dummy circuit according to the detection result of the resistance changes in the at least two different types of resistors, wherein the at least two different types of resistors includes first-type resistors having a first type of resistance change characteristics and second-type resistors having a second type of resistance change characteristics different from the first type of resistance change characteristics.

16. The method of claim 15, wherein the dummy selection signal is activated when the control code has a predetermined value and an amount of the mismatch is equal to or greater than a reference value.

17. The method of claim 15, wherein the dummy selection signal is activated when a connection between the first-type resistors and the signal transmission path is cut off and the second-type resistors are connected to the signal transmission path, according to the control code.

18. The method of claim 15, wherein the dummy resistor has a resistance value corresponding to a largest resistance value among resistance values of the plurality of resistors of the driver circuit.

* * * * *